(12) United States Patent
Enzinna

(10) Patent No.: US 12,038,464 B2
(45) Date of Patent: Jul. 16, 2024

(54) CAPACITANCE SENSING SYSTEMS AND METHODS

(71) Applicant: Advanced Energy Industries, Inc., Fort Collins, CO (US)

(72) Inventor: Donald Enzinna, Lockport, NY (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 0 days.

(21) Appl. No.: 17/694,731

(22) Filed: Mar. 15, 2022

(65) Prior Publication Data

US 2022/0334160 A1  Oct. 20, 2022

Related U.S. Application Data

(60) Provisional application No. 63/162,107, filed on Mar. 17, 2021.

(51) Int. Cl.
| | |
|---|---|
| G01R 27/26 | (2006.01) |
| G01D 5/24 | (2006.01) |
| G01R 19/00 | (2006.01) |
| G01R 33/02 | (2006.01) |

(52) U.S. Cl.
CPC .......... *G01R 27/2605* (2013.01); *G01D 5/24* (2013.01); *G01R 19/0092* (2013.01); *G01R 33/02* (2013.01)

(58) Field of Classification Search
CPC ........ G01R 27/00; G01R 27/02; G01R 27/26; G01R 27/2605; G01R 19/00; G01R 19/0084; G01R 19/0092; G01R 33/00; G01R 33/02; G01D 5/00; G01D 5/12; G01D 5/14; G01D 5/24

USPC .......................... 324/600, 649, 658, 686, 688
See application file for complete search history.

(56) References Cited

U.S. PATENT DOCUMENTS

| | | | |
|---|---|---|---|
| 4,027,203 A * | 5/1977 | Moran | H02H 3/105 |
| | | | 361/96 |
| 6,670,622 B2 | 12/2003 | Heike | |
| 7,558,045 B1 | 7/2009 | Onate et al. | |
| 9,496,793 B2 * | 11/2016 | Bruwer | G01R 27/2605 |
| 2004/0149221 A1 | 8/2004 | Koshimizu | |
| 2008/0055813 A1 | 3/2008 | Hyoung-Kyu | |
| 2009/0033353 A1 | 2/2009 | Yu | |

(Continued)

OTHER PUBLICATIONS

National Instruments—NI (ni.com): "Floating Signal Sources" via link https://www.ni.com/docs/en-US/bundle/usb-6008-6009-feature/page/float-sig-source.html#:~:text=A%20floating%20signal%20source%20is,optical%20isolators%2C%20and%20isolation%20amplifiers (Year: 2015).*

(Continued)

*Primary Examiner* — Hoai-An D. Nguyen
(74) *Attorney, Agent, or Firm* — Neugeboren O'Dowd PC

(57) ABSTRACT

Systems, methods, and apparatuses for measuring capacitance of a load. An apparatus includes a ground connector, an output connector configured to couple to the load, and a time-varying signal source configured to inject a time-varying voltage signal onto a conduction path between the ground connector and the output connector. A DC power source is configured to apply a DC offset to the time-varying voltage signal, and a current monitor is configured to measure time-varying current in the conduction path. A capacitance module is configured to determine the capacitance based upon at least one of the time-varying current and a frequency of the time-varying voltage signal.

18 Claims, 18 Drawing Sheets

(56) References Cited

U.S. PATENT DOCUMENTS

2020/0400719 A1    12/2020  Enzinna
2020/0411356 A1*   12/2020  Fujii .................... H01L 21/683

OTHER PUBLICATIONS

KIPO, "International Search Report and Written Opinion Re International Application No. PCT/US2022/020507", Jul. 14, 2022, pp. 9, Published in: WO.

Xiaofan Tang, International Preliminary Report on Patentability, Sep. 28, 2023, The International Bureau of WIPO, Switzerland.

* cited by examiner

CAPACITANCE SENSING SYSTEMS AND METHODS

CLAIM OF PRIORITY UNDER 35 U.S.C. § 119

The present Application for Patent claims priority to Provisional Application No. 63/162,107 entitled "CAPACITANCE SENSING SYSTEMS AND METHODS" filed Mar. 17, 2021 and assigned to the assignee hereof and hereby expressly incorporated by reference herein.

BACKGROUND

Field

The present invention relates generally to monitoring electrical elements, and more particularly, to monitoring capacitance.

Background

Monitoring capacitance is important in many contexts. Among other contexts, monitoring capacitance is important when electrostatically holding a work piece to a chuck. Electrostatic chucks are used to support workpieces (e.g., wafers) in a variety of processing systems. In a deposition system, for example, an electrostatic chuck may be used to clamp a wafer in place while a thin film is deposited on the wafer. In an etch system, as another example, an electrostatic chuck may be used to clamp a wafer in place while material is being chemically etched from the wafer.

Electrostatic chucks use electrostatic force to hold the workpiece in place. An electrostatic chuck has electrodes that are energized with a clamping voltage, which electrostatically clamps the workpiece to the surface of the electrostatic chuck. The electrodes in the electrostatic chuck are coupled to an electrostatic power supply and a controller. The electrostatic power supply receives the control signal from the controller and generates a clamping voltage adapted to clamp the substrate with a clamping force.

Proper positioning of the workpiece relative to the electrostatic chuck is important at various times before, during, and after typical workpiece processes. For example, it is important to ensure that a workpiece is properly loaded onto the electrostatic chuck before applying the clamping voltage. As another example, it may be desirable to determine whether the workpiece is clamped or unclamped at certain times.

The electrostatic power supply may include a direct current (DC) voltage generator configured to generate a DC clamping voltage for the clamping electrode assembly of the electrostatic chuck and an alternating current (AC) voltage generator configured to generate an AC signal. The position of the workpiece may be detected by monitoring a capacitance of a combination of the workpiece and the electrostatic chuck. For example, when the workpiece is properly positioned on the electrostatic chuck, the sensed capacitance may be higher than when the workpiece is not properly positioned.

The varying level of current provided to the electrostatic chuck (in response to the application of the AC voltage) enables the capacitance of the electrostatic chuck to be monitored, and as a consequence, the position of the workpiece may be monitored by monitoring the current provided to the electrostatic chuck.

Processing techniques continue to move to higher power amplifiers with higher output currents, and these types of amplifiers can be bulky and lossy. DC power supplies can deliver high current in a relatively small form factor, but DC power supplies lack the ability to sense load capacitance.

SUMMARY

The following presents a simplified summary relating to one or more aspects and/or embodiments disclosed herein. As such, the following summary should not be considered an extensive overview relating to all contemplated aspects and/or embodiments, nor should the following summary be regarded to identify key or critical elements relating to all contemplated aspects and/or embodiments or to delineate the scope associated with any particular aspect and/or embodiment. Accordingly, the following summary has the sole purpose to present certain concepts relating to one or more aspects and/or embodiments relating to the mechanisms disclosed herein in a simplified form to precede the detailed description presented below.

Some aspects of the present disclosure may be characterized as an apparatus for measuring capacitance of a load that includes a ground connector configured to couple to ground, an output connector configured to couple to the load, a time-varying signal source, and a DC power source. The DC power source and the time-varying signal source may be arranged in a series conduction path between the ground connector and the output connector. The DC power source may be configured to apply a DC voltage onto the conduction path, and the time-varying signal source may be configured to inject a time-varying signal onto the conduction path. The apparatus may further include a current monitor configured to measure current in the conduction path and a capacitance module coupled to the current monitor, the capacitance module configured to determine the capacitance based upon the measured current.

Other aspects of the present disclosure may be characterized as an apparatus for measuring capacitance of a load that includes a ground connector configured to couple to ground, an output connector configured to couple to the load, and a time-varying signal source configured to inject a time-varying voltage signal onto a conduction path between the ground connector and the output connector. The apparatus may further include a DC power source configured to apply a DC offset to the time-varying voltage signal, a current monitor configured to measure time-varying current in the conduction path, and a capacitance module configured to determine the capacitance based upon at least one of the time-varying current and a frequency of the time-varying voltage signal.

Yet other aspects of the present disclosure may be characterized as a method for determining capacitance of a load that includes applying a time-varying voltage signal with a time-varying signal source to the load, applying a DC offset to the load with a DC power source, and fixing an amplitude of the time-varying voltage signal. The method may further include measuring a time-varying current that is provided to the load and controlling the time-varying signal source to vary a frequency of the time-varying voltage signal to maintain a substantially constant amplitude of the time-varying current provided to the load. The method may further include determining the capacitance based upon the frequency of the time-varying voltage signal.

DETAILED DESCRIPTION

The word "exemplary" is used herein to mean "serving as an example, instance, or illustration." Any embodiment described herein as "exemplary" is not necessarily to be construed as preferred or advantageous over other embodiments.

Disclosed herein are multiple approaches to monitoring capacitance. Although several aspects disclosed herein are separately described, they are not mutually exclusive, and instead, these aspects may be combined in multiple variations to provide improved capacitance sensing. Although the capacitance sensing techniques are described throughout this specification in the context of electrostatic chucking systems, it should be recognized that many of the capacitance-sensing approaches disclosed herein are applicable in other contexts where capacitance sensing is useful.

Figure 1:
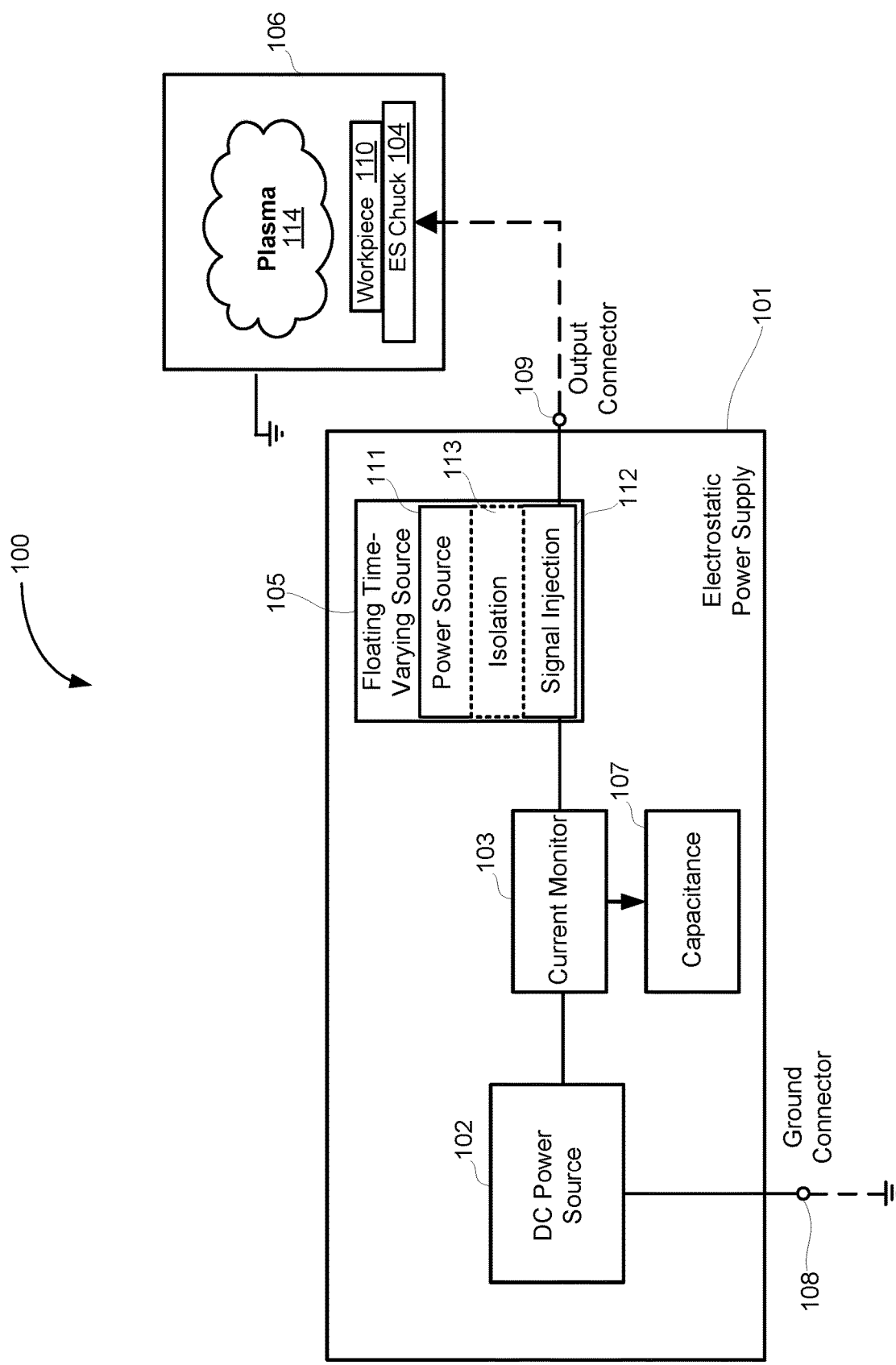
FIG. 1 illustrates an exemplary electrostatic chucking system with an exemplary electrostatic power supply having a floating time-varying source, in accordance with one or more embodiments.

Referring first to FIG. 1, shown is an exemplary electrostatic chucking system 100, which is one environment in which embodiments of capacitance sensing techniques may be utilized. As depicted, the electrostatic chucking system 100 includes an electrostatic power supply 101 and an electrostatic chuck 104. As shown, the electrostatic chuck 104 is positioned within a plasma processing chamber 106, and a workpiece 110 is shown clamped to the electrostatic chuck 104.

In this exemplary application, the plasma processing chamber 106 may be realized by chambers of substantially conventional construction (e.g., comprising a vacuum enclosure which is evacuated by a pump or pumps (not shown)). And, as one of ordinary skill in the art will appreciate, the plasma excitation in the plasma processing chamber 106 may be achieved by any one of a variety of sources comprising, for example, a helicon type plasma source, which includes magnetic coil and antenna to ignite and sustain a plasma 114 in the reactor, and a gas inlet may be provided for introduction of a gas into the plasma processing chamber 106.

As depicted, the workpiece 110 to be treated (e.g., a semiconductor wafer), is supported at least in part by the electrostatic chuck 104, and power is applied to the electrostatic chuck 104 via one or more conductors (e.g., cables). For simplicity only a single conductor is shown coupled the electrostatic chuck 104, but it should be recognized that aspects described herein are applicable to monopolar chucks and multipolar chucks. As an example, those of ordinary skill in the art will appreciate that six power lines and six corresponding capacitance monitors may be employed in connection with a hexapolar electrostatic chuck.

In general, the electrostatic power supply 101 is capable of applying a voltage that includes steady-state and time-varying components, such as DC and AC components. For example, the DC voltage may effectuate a DC clamping voltage at the electrostatic chuck 104 that draws the workpiece 110 to the electrostatic chuck 104 while the AC voltage may be utilized to monitor chuck capacitance, such as via a capacitance module 107 (e.g., to detect a position of the workpiece 110 relative to the electrostatic chuck 104).

As shown, the electrostatic power supply 101 may include a ground connector 108 configured to couple to ground, an output connector 109 configured to couple to a load (e.g., the combination of the electrostatic chuck 104 and the workpiece 110), a DC power source 102, and a floating time-varying source 105 (also referred to as a floating time-varying signal source or a floating time-varying power source) coupled between the DC power source 102 and the output connector 109. The time-varying sources disclosed herein, such as the floating time-varying source 105, may be realized, for example, by an AC source configured to provide an AC signal or a time-varying DC source configured to provide a time-varying DC signal, such as through utilizing ramp and step functions. As shown, the floating time-varying source 105 and the DC power source 102 are arranged in series in a conduction path between the ground connector 108 and the output connector 109. The DC power source 102 is configured to apply a DC voltage onto the conduction path and the time-varying source 105 is configured to inject a time-varying signal (also referred to as a time-varying voltage signal), such as an AC signal, on to the conduction path. Also shown is a current monitor 103 that is configured to measure current in the conduction path, and a capacitance module 107 is coupled to the current monitor. The capacitance module 107 is configured to determine the capacitance based upon the measured current.

In operation, the DC voltage applied by the DC power source 102 depicted in FIG. 1 (and throughout the figures of the present disclosure) may effectuate the DC clamping voltage when the electrostatic power supply 101 is coupled to the electrostatic chuck 104. For example, the DC power source 102 depicted in FIG. 1 (and throughout the figures of the present disclosure) may be capable of applying 1000 volts DC, but this voltage is exemplary only and may vary depending upon many factors. In many implementations, the DC power source 102 is realized by a switch-mode power supply, which can deliver high currents in a small form factor at high efficiency; thus, with less heat as compared to a linear amplifier. The time-varying voltage injected by the floating time-varying source 105 may be 10 to 20 volts AC (peak-to-peak) at 1 kHz, but these voltages and frequency are exemplary only and may vary depending upon the many factors.

As shown, the floating time-varying source 105 includes a power source 111 and a signal injection component 112, which are separated by an isolation component 113. The signal injection component 112 is coupled to the conduction path with terminals that are galvanically isolated from other components of the electrostatic power supply 101.

In one implementation, the power source 111 is implemented by a time-varying power source, such as an AC power source, and a transformer is used to realize the isolation component 113 and signal injection component 112. For example, a primary side of the transformer may be coupled to the power source 111 and the secondary side of the transformer may be disposed along the conduction path. The floating time-varying power source 105 (e.g., AC power source) may be realized, for example without limitation, by a linear amplifier or a switch-mode (e.g., class D) amplifier.

In another implementation, the floating time-varying source 105 may be a floating AC source configured to inject an AC signal onto the conduction path. The floating AC source includes a direct digital synthesizer to produce a DC representation of the AC signal and a digital-to-analog converter is used to convert the DC representation to the AC signal. In this implementation, the direct digital synthesizer and the digital-to-analog converter receive power and control signals via galvanically-isolating coupling.

In yet another implementation, the floating time-varying source 105 includes an oscillator to produce the time-varying signal (e.g., AC signal) wherein the oscillator receives power and control signals via galvanically-isolating coupling.

The current monitor 103 depicted in FIG. 1 (and throughout the drawing figures of the present disclosure) may be realized by a flux gate sensor, a hall effect sensor, resistive shunt sensor, or a current mirror circuit.

In some implementations, the capacitance monitoring aspects are implemented in a separate housing from the DC power source 102 of the electrostatic power supply 101. For example, an apparatus for measuring capacitance of a load may be implemented without the DC power source 102, and the apparatus for measuring capacitance may not have the functionality to clamp the workpiece 110 to the chuck 104.

In some implementations, the current measuring or capacitance monitoring aspects may comprise an analog-to-digital converter used to convert an analog representation of the measured current into a digital signal representation of the measured current. The capacitance monitoring aspects (e.g., the capacitance module 107) may process the digital signal representation of the measured current, such as through filtering and synchronous detection, to determine the capacitance (e.g., via frequency and phase data extracted from the digital signal representation of the measured current). In a similar manner, measured voltage signals of the present disclosure may be converted into a digital signal representation and processed by the capacitance monitoring aspects to aid in determining capacitance.

To detect a position of the workpiece 110 in the context of the electrostatic chucking system 100, the relationship between capacitance and positions of workpiece may be empirically determined, and threshold capacitances may be established that are indicative of, for example, the workpiece 110 "in place" or the workpiece 110 "in clamp." The threshold capacitance values may be stored in nonvolatile memory in connection with workpiece position data to enable a mapping between capacitance values and workpiece position. The workpiece position may be determined using the empirically obtained data in connection with the current measurements to obtain a capacitance seen at the electrostatic chuck 104. As those of ordinary skill in the art readily appreciate, capacitance of a load may be determined based upon the time-varying (e.g., AC) voltage and current as follows:

$$I(t) = C\frac{dV}{dt}.$$

Once the capacitance of the load (e.g., the combination of the electrostatic chuck 104 and the workpiece 110) is obtained, the position of the workpiece 110 may be obtained by reference to the stored data in nonvolatile memory.

Figure 2:
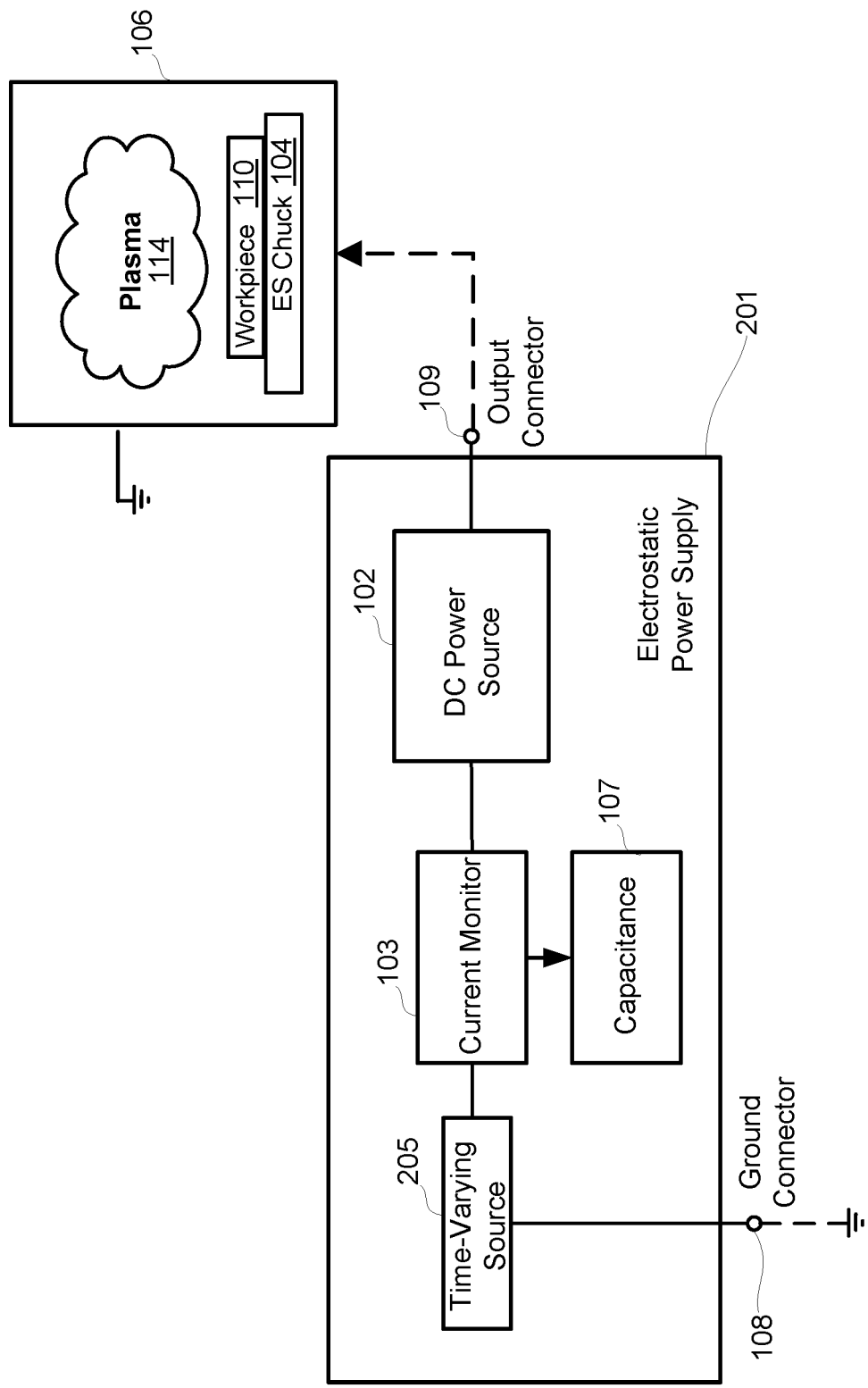
FIG. 2 illustrates an exemplary electrostatic power supply with a time-varying source coupled on a low side of a DC power source, in accordance with one or more embodiments.

Referring next to FIG. 2, shown is another exemplary electrostatic power supply 201 (e.g., an electrostatic chuck power supply). In this implementation, the electrostatic power supply 201 includes a ground connector 108 configured to couple to ground, an output connector 109 configured to couple to a load (e.g., the combination of the electrostatic chuck 104 and the workpiece 110), a time-varying source 205, and a DC power source 102 coupled between the time-varying source 205 and the output connector 109. As shown, the DC power source 102 and the time-varying source 205 are arranged in series in a conduction path between the ground connector 108 and the output connector 109, and the DC power source 102 is configured to apply a DC voltage on to the conduction path and the time-varying source 205 is configured to inject a time-varying signal on to the conduction path. A current monitor 103 is configured to measure current in the conduction path, and a capacitance module 107 is coupled to the current monitor 103. The capacitance module 107 is configured to determine the capacitance based upon the measured current.

The implementation depicted in FIG. 2 is similar to the implementation in FIG. 1 in that, in each implementation, a time-varying source and a DC power source 102 are arranged in a series conduction path between the ground connector 108 and the output connector 109. But in the implementation of FIG. 2, the time-varying source 205 need not be floating as shown in FIG. 1 because the time-varying source 205 is coupled to a low side of the DC power source 102. The time-varying source 205 (and other time-varying sources depicted and described herein) may, for example, be an AC source realized by a linear amplifier or a switch-mode amplifier. The time-varying voltage injected onto the conduction path by the time-varying source 205 may be 10 to 20 volts AC (peak-to-peak) at 1 kHz, but these voltages and frequency are exemplary only and may vary depending upon the many factors.

Figure 3:
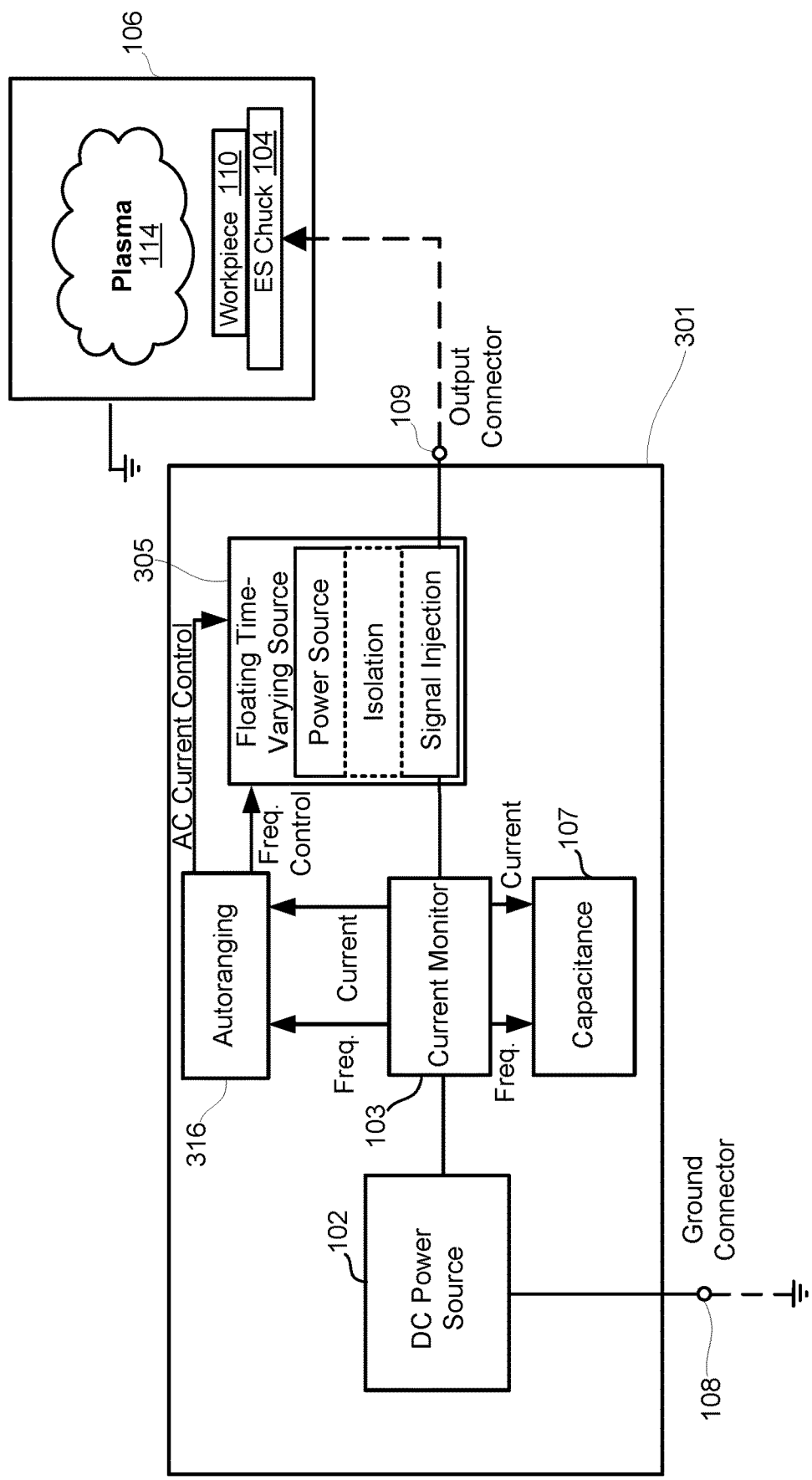
FIG. 3 illustrates an exemplary electrostatic power supply with an autoranging module and a floating time-varying source, in accordance with one or more embodiments.
Figure 4:
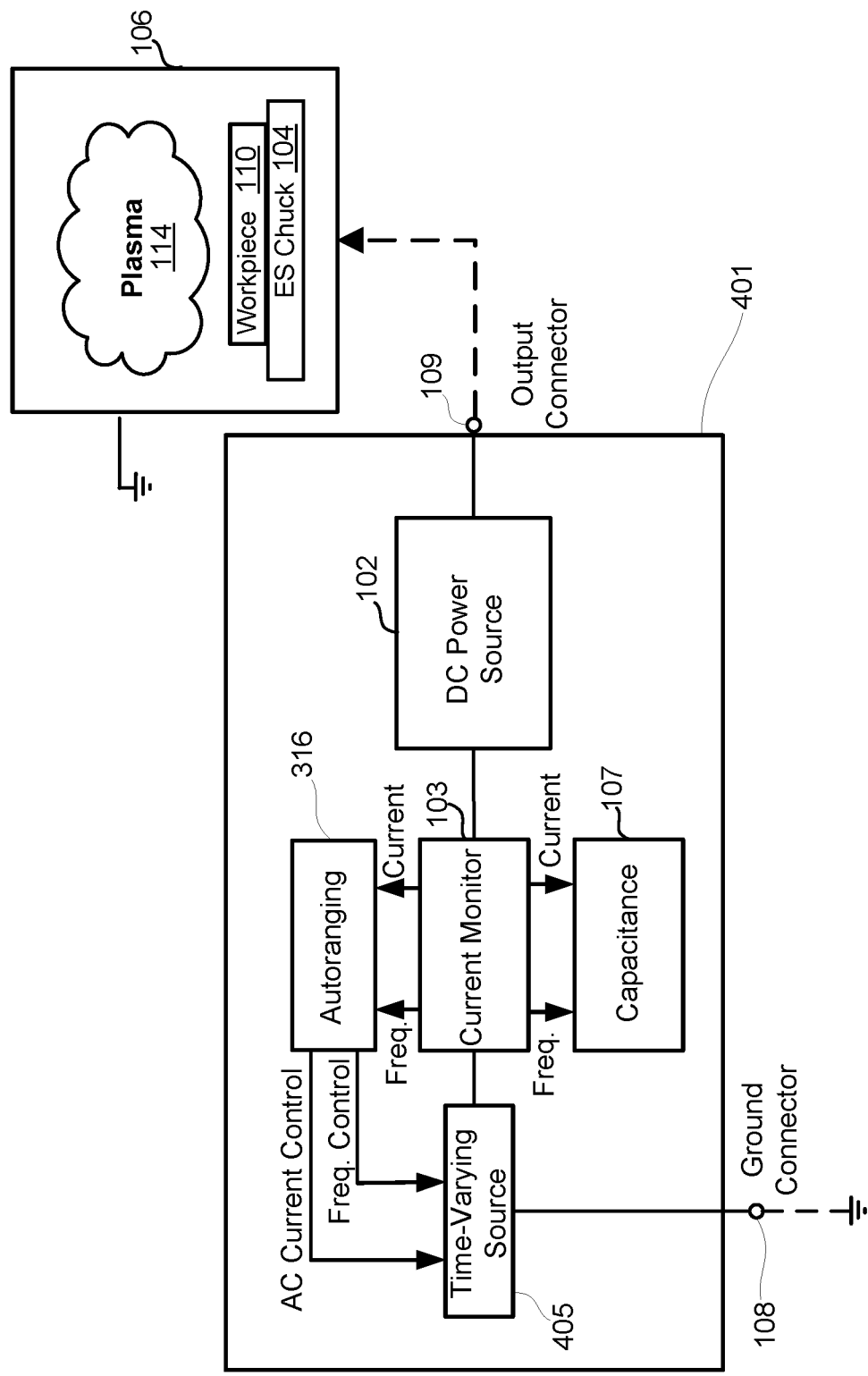
FIG. 4 illustrates an exemplary electrostatic power supply with an autoranging module and a time-varying source coupled on a low side of a DC power source, in accordance with one or more embodiments.

Referring next to FIGS. 3 and 4, shown are other variations of electrostatic power supplies. As shown, the electrostatic power supplies 301 and 401 in FIGS. 3 and 4 include a ground connector 108 configured to couple to ground, an output connector 109 configured to couple to a load (e.g., the combination of the electrostatic chuck 104 and the workpiece 110), and a time-varying source (e.g., floating time-varying source 305 and time-varying source 405), configured to inject a time-varying voltage signal on to a conduction path between the ground connector 108 and the output connector 109. Also shown is a DC power source 102 configured to apply a DC offset to the time-varying signal and a current monitor 103 configured to measure time-varying current in the conduction path.

In the variation depicted in FIG. 3, the time-varying source is realized by a floating time-varying source 305 arranged in series with the DC power source 102 in the conduction path, and the floating time-varying source 305 may be realized in much the same way as the floating time-varying source 105 described with reference to FIG. 1. For example, the floating time-varying source 305 may couple the time-varying signal to the conduction path via a transformer. Or the floating time-varying source 305 may be a floating AC source configured to inject an AC signal onto the conduction path, and the floating AC source may include a direct digital synthesizer to produce a DC representation of the AC signal and a digital-to-analog converter to convert the DC representation to the AC signal, wherein the direct digital synthesizer and the digital-to-analog converter receive power and control signals via galvanically-isolating coupling. As another alternative, the floating time-varying source 305 includes an oscillator to produce the time-varying signal (e.g., AC signal) wherein the oscillator receives power and control signals via galvanically-isolating coupling.

In the variation depicted in FIG. 4, the time-varying source 405 is positioned on a low side (e.g., ground side) of the DC power source 102, and in this topology, the time-varying source 405 may be directly connected to the conduction path (e.g., without galvanic isolation) in the same way as the time-varying source 205 in FIG. 2 is positioned in the conduction path.

In both of the variations depicted in FIGS. 3 and 4, an autoranging module 316 may be configured to operate in at least two modes of operation. In a first mode of operation, a frequency of the time-varying source (e.g., floating time-varying source 305 and time-varying source 405) may be controlled and adjusted to maintain an amplitude of time-varying current (provided by the time-varying source) at a fixed level. The capacitance module 107 may then be used to measure capacitance based upon the frequency of the time-varying source. In a second mode of operation, a current of the time-varying source may be controlled and adjusted to maintain a frequency of the time-varying source at a fixed level. In this second mode of operation, the capacitance module 107 may then be used to measure capacitance based upon the time-varying current provided by the time-varying source.

Figure 5:
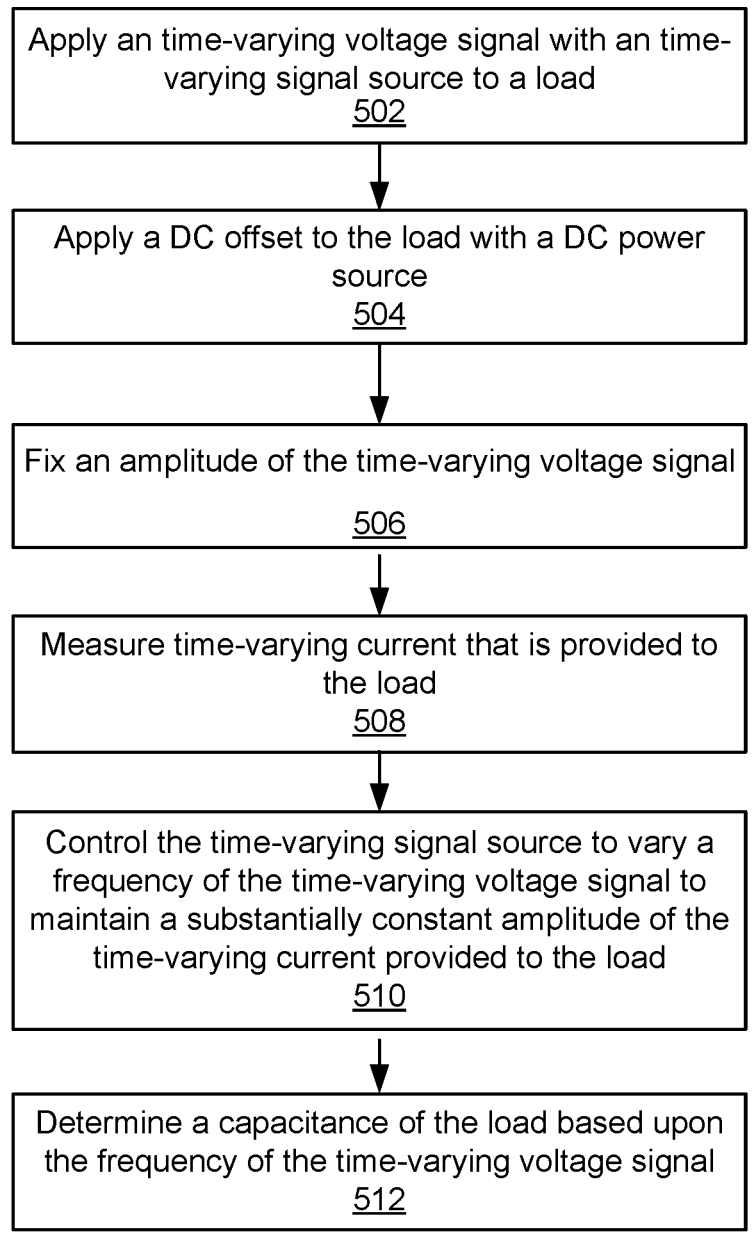
FIG. 5 is a flowchart depicting an exemplary method for determining capacitance of a load based upon a frequency of a time-varying voltage signal of an electrostatic power supply, in accordance with one or more embodiments.

While referring to FIGS. 3 and 4, the first mode of operation is described with simultaneous reference is made to FIG. 5, which is a flowchart depicting a method that may be traversed in connection with the electrostatic power supplies 301 and 401 depicted in FIGS. 3 and 4, respectively. In operation, as shown in FIG. 5, a time-varying voltage signal (e.g., AC voltage signal) is applied with the time-varying source (e.g., the floating time-varying source 305 and time-varying source 405, which may each be realized by an AC source) to the load (Block 502), and a DC offset is applied with the DC power source 102 (Block 504). For example, the time-varying source may be galvanically isolated from ground (e.g., as a floating time-varying source). An amplitude of the time-varying voltage signal is fixed (Block 506), the time-varying current (e.g., AC current) that is provided to the load is measured (Block 508), and the time-varying source is controlled to vary a frequency of the time-varying voltage signal to maintain a substantially constant amplitude of the time-varying current provided to the load (Block 510). The capacitance is then determined based upon the frequency of the time-varying voltage signal (Block 512). The voltage of the time-varying signal, current, frequency, and capacitance are related as follows:

$$V(t) = \frac{I(t)}{2\pi f C}.$$

And because the time-varying voltage and the time-varying current are fixed, the capacitance of the chuck-workpiece combination may be determined from the following relationship:

$$C \propto \frac{1}{f}.$$

Using this technique, high resolution capacitance measurements may be obtained in the time domain. By keeping the amplitude of the measured time-varying current at a constant, non-linearities in the current measurement circuit are avoided, potentially increasing accuracy. Moreover, it is anticipated that the capacitance-range function typically used in prior implementations may be eliminated and problems associated with a limited measurement range may be eliminated. In prior art implementations, for example, when the capacitance measurement range is exceeded, data is lost, the system range must be increased, and the system needs to be re-zeroed. Productivity in these prior art systems is reduced because processing (e.g., plasma processing) must be interrupted. In addition, if the capacitance measurement range in prior art systems is too large, resolution is lost and sensitivity to small changes is compromised.

Figure 6:
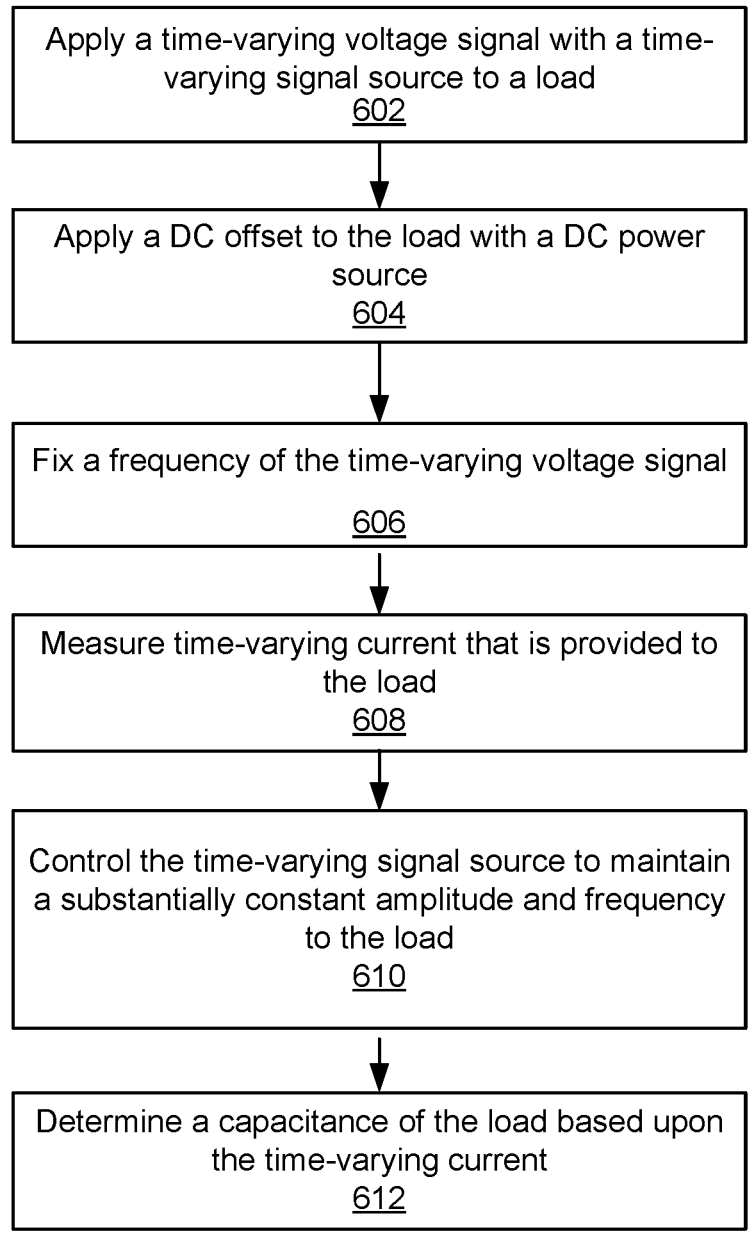
FIG. 6 is a flowchart depicting an exemplary method for determining capacitance of a load based upon time-varying current of an electrostatic power supply, in accordance with one or more embodiments.

The second mode of operating the autoranging module 316 is described with simultaneous reference to FIGS. 3, 4 and FIG. 6, which is a flowchart depicting a method that may be traversed in connection with the electrostatic power supplies 301 and 401 depicted in FIGS. 3 and 4, respectively. In the second mode of operation, as shown in FIG. 6, a time-varying voltage signal (e.g., AC voltage signal) is applied with the time-varying source (e.g., the floating time-varying source 305 and time-varying source 405, which may each be realized by an AC source) to the load (Block 602), and a DC offset is applied with the DC power source 102 (Block 604). A frequency of the time-varying voltage signal is fixed (Block 606), the time-varying current (e.g., AC current) that is provided to the load is measured (Block 608), and the time-varying source is controlled to maintain a substantially constant amplitude and frequency to the load (Block 610). The capacitance is then determined based upon the current of the time-varying voltage signal (Block 612). Because the time-varying voltage and the time-varying frequency are fixed, then the capacitance of the chuck-work piece combination may be determined from the following relationship:

$$C \propto I.$$

To measure time-varying current, a peak-to-peak detector, root-mean-square detector, or a synchronous detector may be used, such as in a current monitor, to measure time-varying current in the conduction path, such as AC current.

Figure 7:
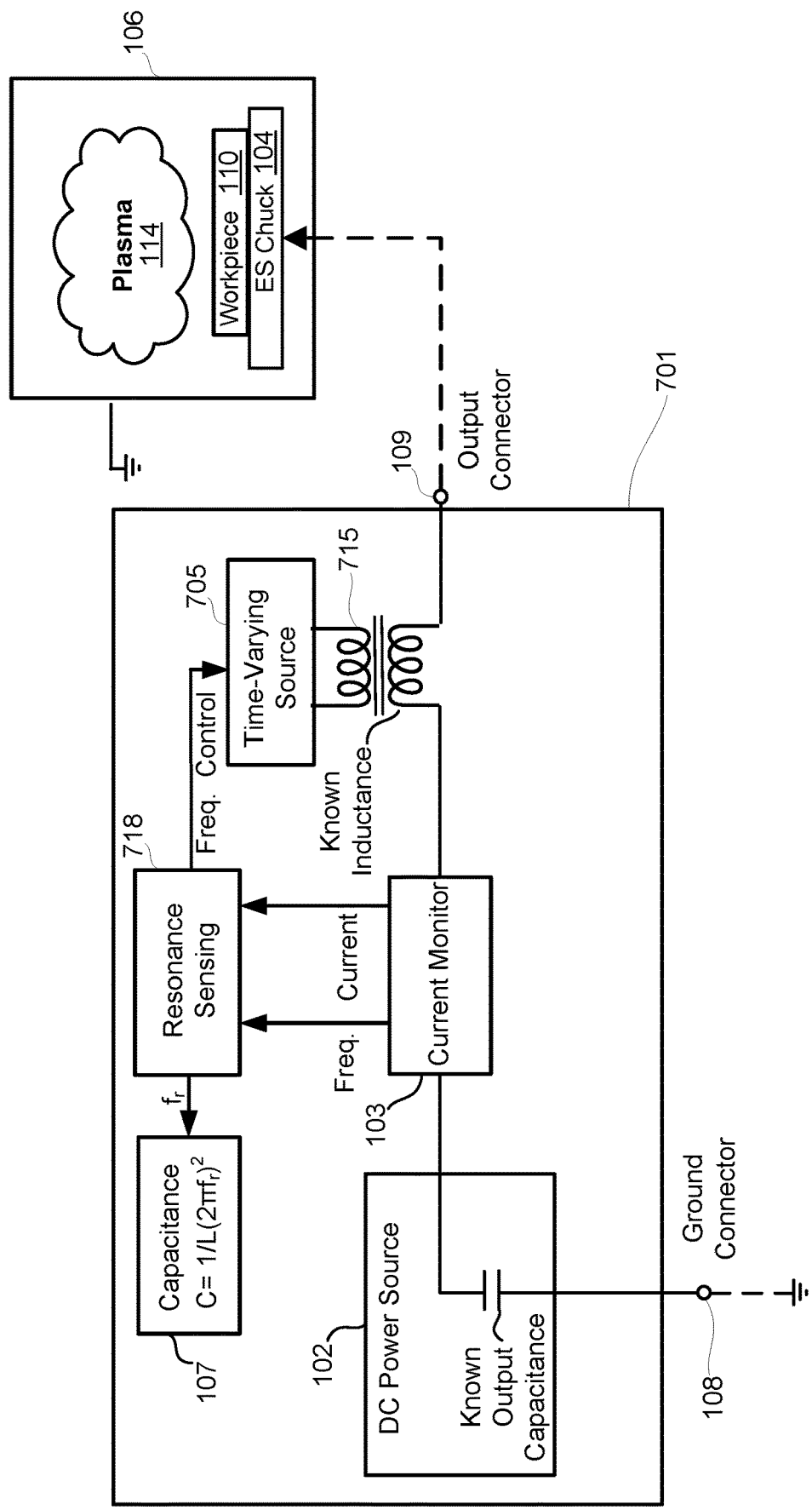
FIG. 7 illustrates an exemplary electrostatic power supply with a resonance sensing module, in accordance with one or more embodiments.

Referring next to FIG. 7, shown is a block diagram depicting another exemplary electrostatic power supply 701 where frequency adjustment is utilized to determine a capacitance of a load. As shown, the electrostatic power supply 701 in FIG. 7 comprises a ground connector 108 configured to couple to ground, an output connector 109 configured to couple to the load (e.g., the combination of the electrostatic chuck 104 and the workpiece 110), and a time-varying source 705 configured to inject a time-varying voltage signal on to a conduction path between the ground connector 108 and the output connector 109.

Also shown is a DC power source 102 (with a known output capacitance) configured to apply a DC offset to the time-varying signal and a current monitor 103 configured to measure time-varying current in the conduction path. As shown in FIG. 7, the time-varying source 705 is coupled to the conduction path via a transformer 715, which has a known inductance. Also shown in FIG. 7 is a resonance sensing module 718 that is coupled to the current monitor 103 and the time-varying source 705. In addition, a capacitance module 107 is coupled to the resonance sensing module 718.

Figure 8:
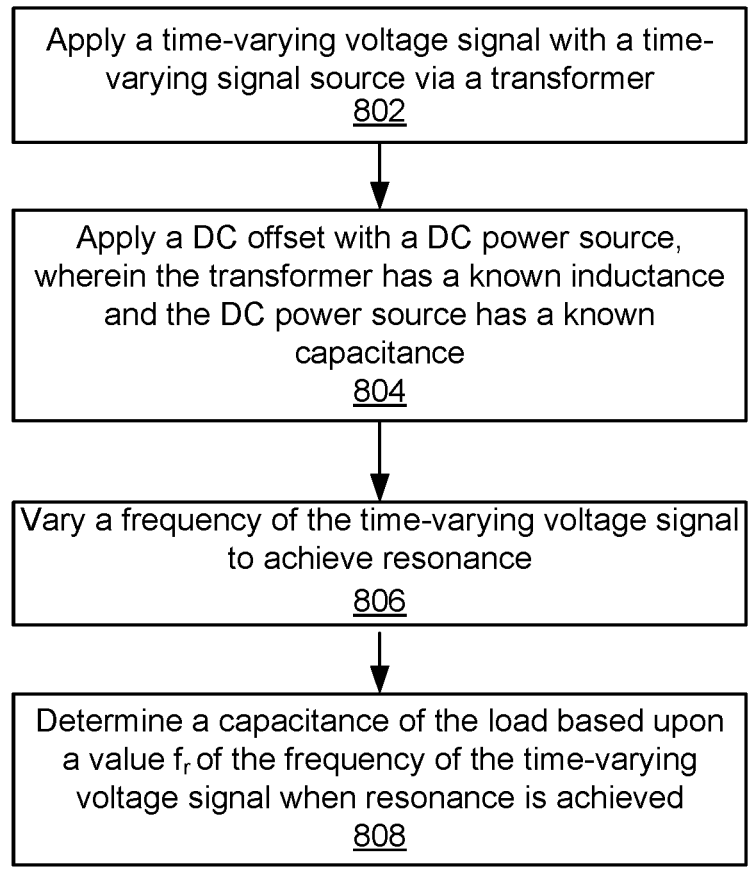
FIG. 8 is a flowchart depicting an exemplary method for determining capacitance of a load based upon a frequency of a time-varying voltage signal of an electrostatic power supply when resonance is achieved, in accordance with one or more embodiments.

While referring to FIG. 7, simultaneous reference is made to FIG. 8, which is a flowchart depicting a method that may be carried out in connection with the electrostatic power supply 701 of FIG. 7. As shown, a time-varying signal (e.g., AC signal) is applied to the conduction path via the transformer 715 (Block 802), and a DC offset is applied with the DC power source 102 (Block 804). A frequency of the time-varying signal is varied until the resonance sensing module 718 detects resonance (Block 806). For example, the resonance sensing module 718 may receive both, information about a level of the time-varying current and a frequency of the time-varying current, and resonance is detected when time-varying current is minimized and changes from phase lead to phase lag. Once resonance is achieved, a capacitance of the load may be determined based upon the resonant frequency, $f_r$, of the time-varying signal, such in the capacitance module 107 (Block 808). More specifically, $$f_r = \frac{1}{2\pi\sqrt{LC}}$$

where L is the known inductance of the transformer 715 and C is the capacitance of the series combination of the known capacitance of the DC power source 102 and the unknown load capacitance.

Figure 9:
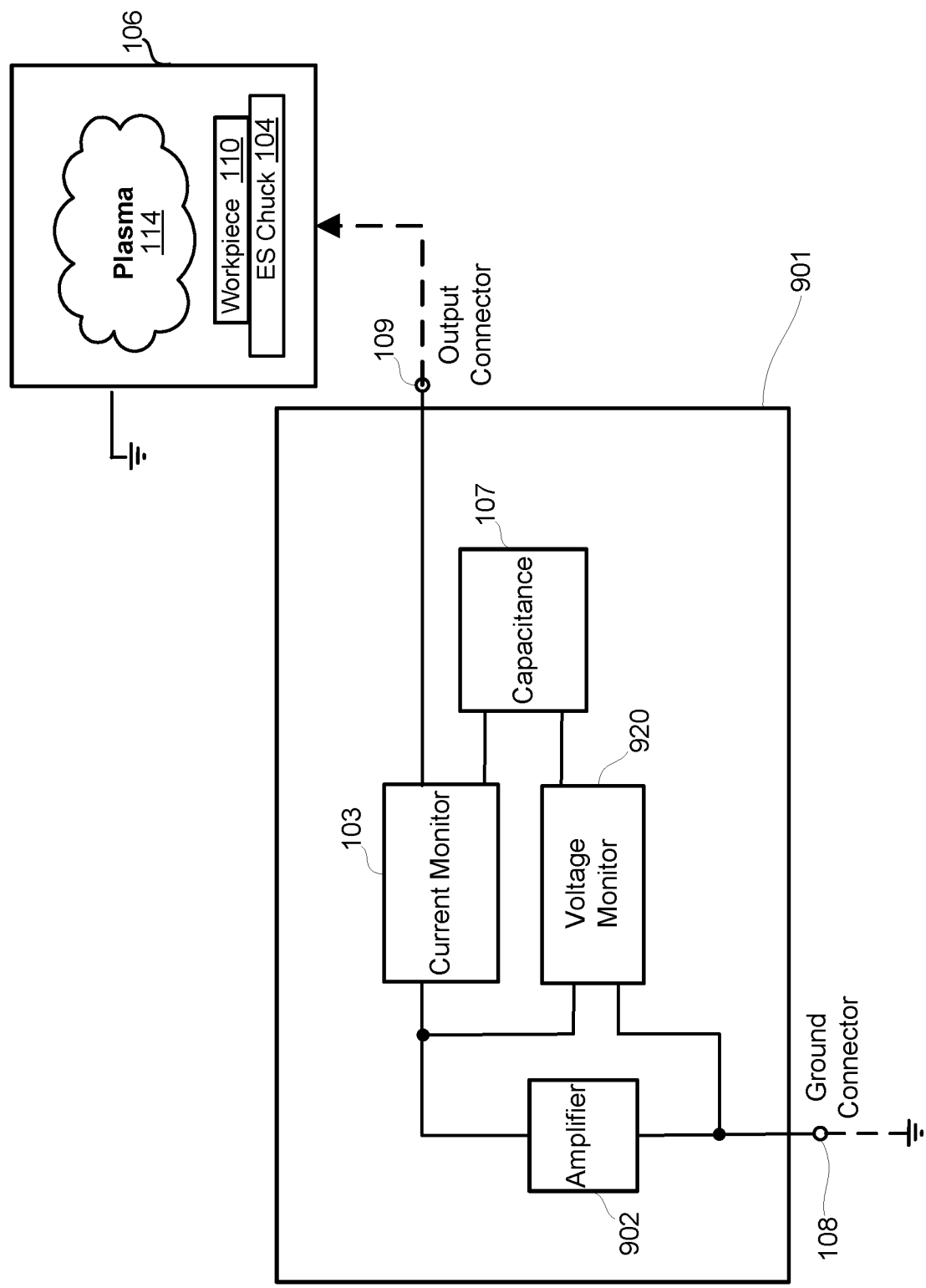
FIG. 9 illustrates an exemplary electrostatic power supply with a voltage monitor, in accordance with one or more embodiments.

Referring next to FIG. 9, shown is a block diagram depicting another exemplary electrostatic power supply 901. In this implementation, the electrostatic power supply 901 includes a ground connector 108 configured to couple to ground, an output connector 109 configured to couple to a load (e.g., the combination of the electrostatic chuck 104 and the workpiece 110), and an amplifier 902 coupled in a conduction path between the ground connector 108 and the output connector 109. A current monitor 103 is positioned and configured to measure current in the conduction path, and a voltage monitor 920 is coupled across the amplifier 902 to measure the voltage across the amplifier 902. A capacitance module 107 is coupled to both the current monitor 103 and the voltage monitor 920.

In this variation, the amplifier 902 may apply both a high DC (e.g., 1000V) as a clamping voltage and a low time-varying voltage (e.g., 10V AC) for capacitance measurement. The amplifier 902 may be realized by any of a class A, B, C, D, or E amplifier. Applicant has recognized that capacitance measurement is affected by amplifier gain and fidelity, and that what is needed is an approach to improve capacitance-measurement accuracy by compensating for changes in amplifier gain and fidelity. More specifically, it has been found that it is common for the time-varying signal to change amplitude with changing capacitive load resulting in non-linearities in the capacitance sensing. Although the amplitude can be calibrated in the short term, the problem is long term. Over time and changing environmental conditions, the time-varying amplitude can change or become distorted resulting in a calibration drift.

Figure 10:
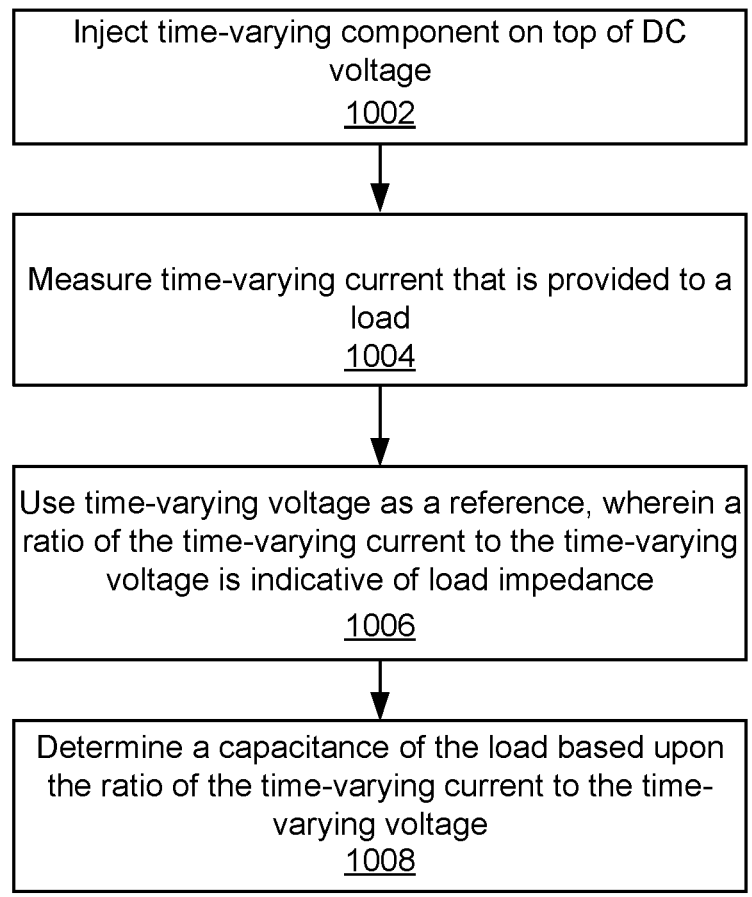
FIG. 10 is a flowchart depicting an exemplary method for determining capacitance of a load based upon a ratio of a time-varying current to a time-varying voltage of an electrostatic power supply, in accordance with one or more embodiments.

To address this issue, the electrostatic power supply 901 of FIG. 9 may be operated using the method depicted in FIG. 10. As shown in FIG. 10, a time-varying signal component (e.g., AC signal component) is injected on top of a DC voltage, such as by the amplifier 902 (Block 1002), and time-varying current (e.g., AC current) that is provided to the load is measured by the current monitor 103 (Block 1004). In addition, the time-varying voltage applied (e.g., AC voltage) by the amplifier 902 is measured by the voltage monitor 920, and the time-varying voltage is used as a reference (Block 1006). The ratio of the time-varying current to the time-varying voltage is indicative of the load impedance, and more specifically, a capacitance of the load is proportional to the time-varying current divided by time-varying voltage. Thus, a capacitance of the load may be determined based upon the ratio of the time-varying current to the time-varying voltage, such as by the capacitance module 107 (Block 1008). Determining the capacitance in this way allows the amplitude of the time-varying signal to vary with load impedance while providing a high-level of accuracy.

As discussed above, by measuring capacitance in an electrostatic chuck, a wafer position may be determined and quality of holding forces upon the wafer may be assessed. But newer chuck materials exhibit capacitance values that change dramatically due to factors other than wafer position. For example, many chuck materials have an unstable capacitance that can substantially vary with temperature. This is due to the dielectric constant of the chuck material(s) changing with temperature. In particular, the dielectric constant may be thermally very unstable—especially at low frequencies.

Figure 11:
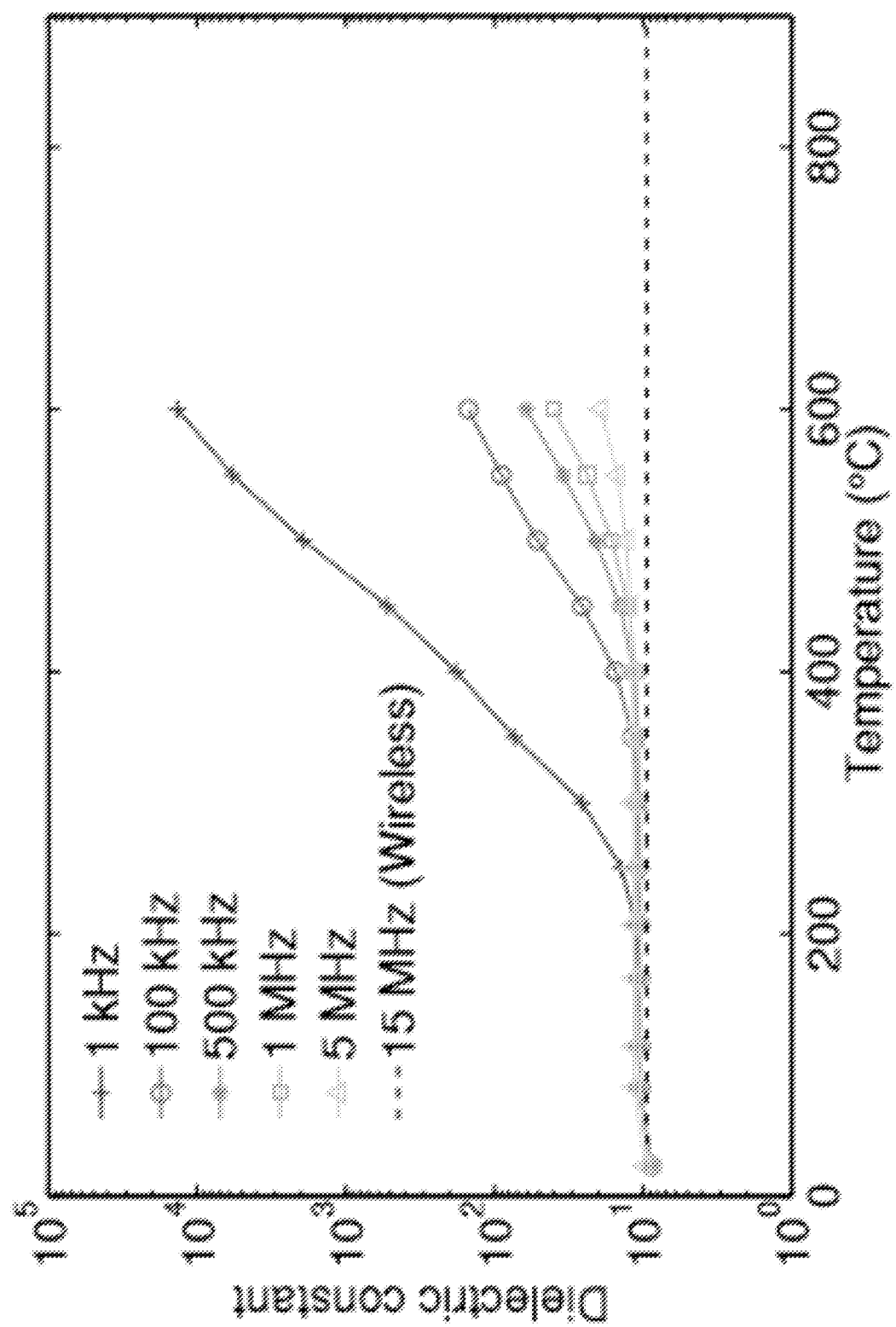
FIG. 11 is a graph depicting a changing dielectric constant of sintered aluminum nitride due to temperature and signal frequency.

Referring to FIG. 11 for example, shown is a graph depicting a dielectric constant of sintered aluminum nitride measured in a hot-chuck probe station up to 600 degrees Celsius for frequencies in the range of 1 kHz to 5 MHz, and using a wireless reading for 15 MHz. As shown, the temperature stability of the dielectric constant is seen to increase with frequency of an injected signal.

Figure 12:
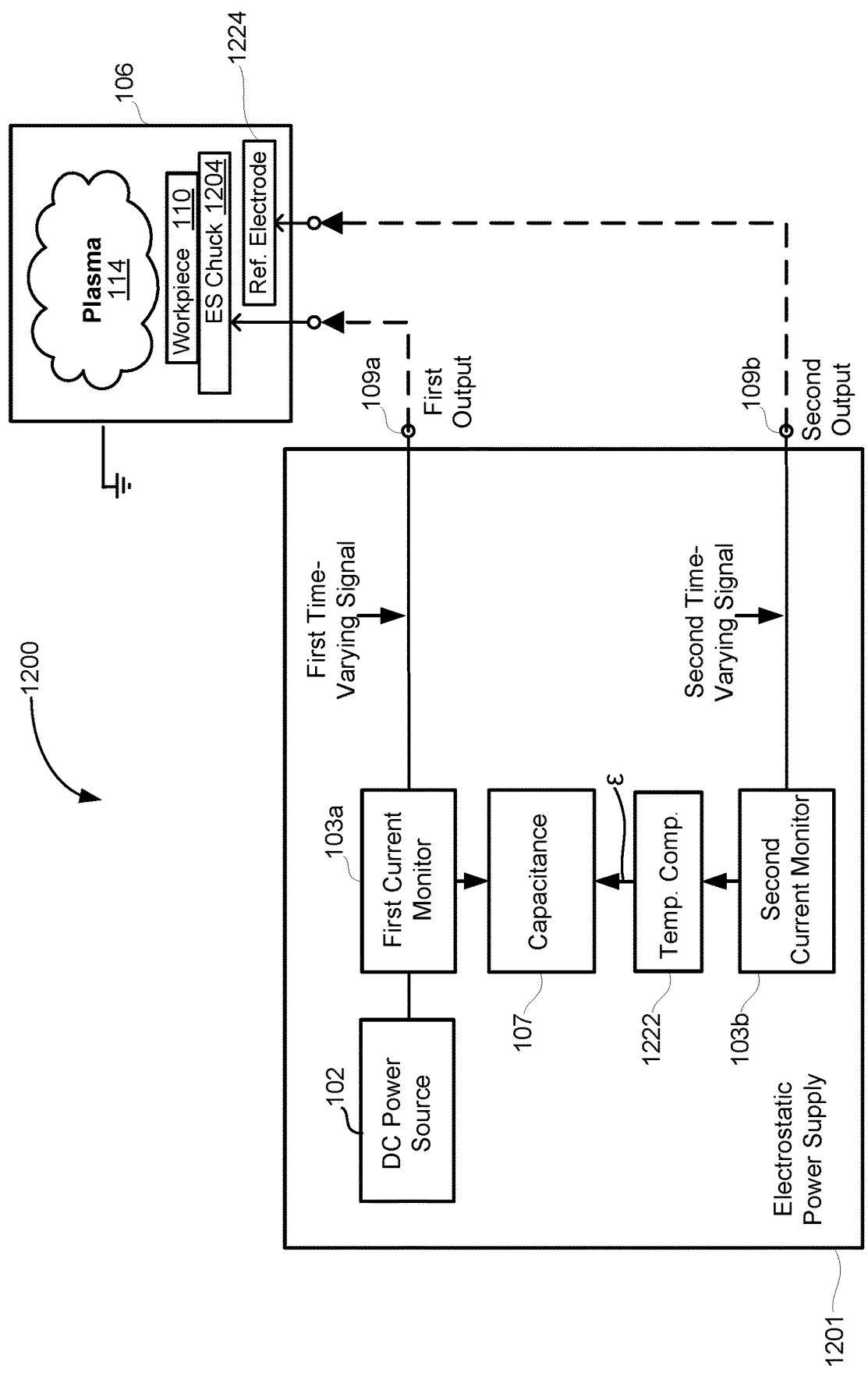
FIG. 12 illustrates an exemplary electrostatic chucking system with an exemplary electrostatic power supply configured for capacitance compensation, in accordance with one or more embodiments.

The system 1200 depicted in FIG. 12 (and also described with reference to FIG. 13) adds a simple means for measuring the capacitance of a chuck, which is independent of wafer position so that it reflects changes due to environmental factors (e.g., temperature). This chuck-capacitance-measurement may be used to adjust an interpretation of the wafer capacitance. More specifically, at a high level, two capacitance measurements are utilized, and one of the two capacitance measurements is adjusted based upon the other capacitance measurement. In particular, a sensed capacitance, Csense, is indicative of the chuck capacitance due in part to the wafer (e.g., comprising a position of the wafer), and a reference capacitance, Cref, is indicative of the chuck capacitance without he wafer, which varies with temperature.

As shown in FIG. 12, an electrostatic power supply 1201 comprises a DC power source 102 coupled to a first output 109a via a first current path (also referred to as a conduction path) that is monitored by a first current monitor 103a, and a first time-varying signal is injected into the current path (e.g., by a time-varying signal source). Also shown is a second current path that couples to a second output 109b, and a second time-varying signal is also injected into the second current path. A second current monitor 103b is positioned to monitor time-varying current in the second current path, and the second current monitor 103b is coupled to a temperature compensation module 1222. Also shown is a capacitance module 107 that is coupled to the first current monitor 103a and the temperature compensation module 1222.

The first output 109a of the electrostatic power supply 1201 is coupled to an electrostatic chuck 1204, which may comprise one or more clamping electrodes as described further herein. And the second output 109b is coupled to a reference electrode 1224, which is positioned in close proximity to the electrostatic chuck 1204. For example, the reference electrode 1224 is positioned to be close enough to the electrostatic chuck 1204 so that the reference electrode 1224 is in a thermal environment that approximates the thermal environment of the electrostatic chuck 1204. In some implementations, for example, the reference electrode 1224 is embedded within the chuck 1204.

Figure 13:
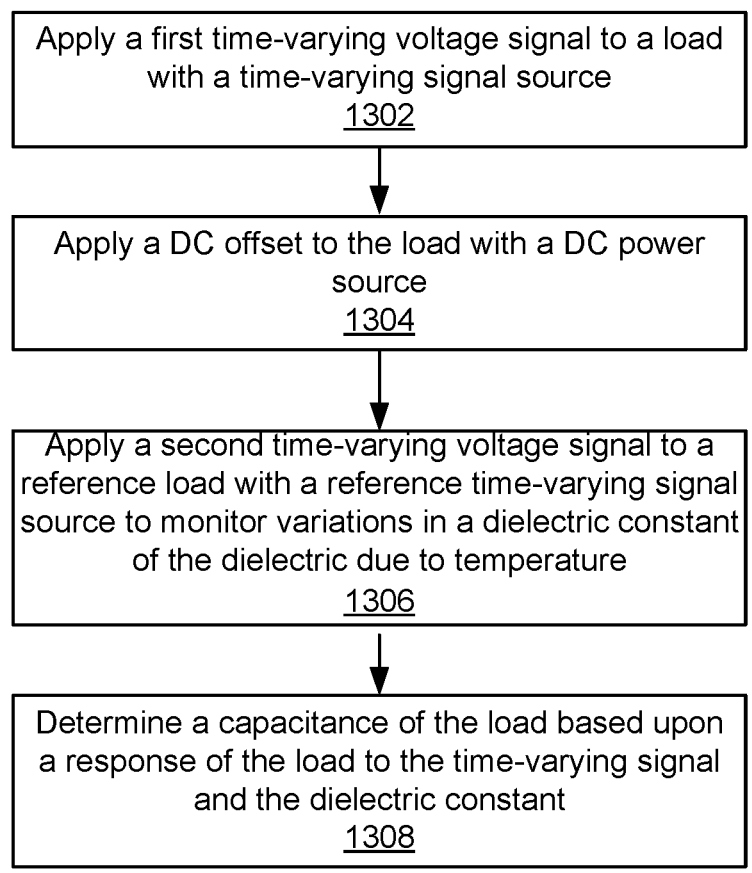
FIG. 13 is a flowchart depicting an exemplary method for determining capacitance of a load based upon a response of the load to a time-varying signal of an electrostatic power supply and a dielectric constant, in accordance with one or more embodiments.

While referring to FIG. 12, simultaneous reference is made to FIG. 13, which is a flowchart depicting a method that may be traversed in connection with the system 1200 depicted in FIG. 12. As shown in FIG. 13, the first time-varying signal (e.g., a first AC signal) is applied to a load (e.g., the electrostatic chuck 1204) with a time-varying signal source (Block 1302), and a DC offset is applied to the load with the DC power source 102 (Block 1304). In FIG. 12 the first time-varying signal is shown being injected (e.g., by a floating time-varying source) on a high side of the DC power source 102, but as described with reference to FIG. 2, a time-varying source may be coupled on a low side of the DC power source 102 (without galvanic isolation) to inject a time-varying signal. The DC power source 102 is utilized to apply the DC offset as a clamping voltage to hold the workpiece 110 to the chuck 1204, and the first time-varying signal is used to obtain an initial measurement of the chuck capacitance. More specifically, the first current monitor 103a obtains a measurement of the time-varying current (e.g., AC current) in the first current path, and the capacitance module 107 receives the time-varying current measurement (e.g., a digital or analog signal that represents the time-varying current).

In addition, a second time-varying signal (e.g., a second AC signal) is applied to a reference load (e.g., the reference electrode 1224) to monitor variations in a dielectric constant of the dielectric due to temperature (Block 1306). For example, the second current monitor 103b obtains a measurement of the time-varying current in the second current path (that includes the current path through the second output 109b). As shown, the temperature compensation module 1222 receives the measure of current in the second current path (e.g., as a digital or analog signal). And in response, the temperature compensation module 1222 may determine the relative permittivity (dielectric constant), ε, of the chuck material because $\varepsilon = C_r d_r / A_r$, where the reference electrode capacitance, Cr, is calculated as described herein; $d_r$ is a known distance between the reference electrode 1224 and a clamping electrode in the chuck 1204; and $A_r$ is a known area of the reference electrode 1224. As shown, the temperature compensation module 1222 may provide the relative permittivity (dielectric constant), ε, to the capacitance module 107, and the capacitance module 107 may determine the capacitance of the load of the chuck-wafer combination based upon the dielectric constant and information from the first time-varying current monitor 103a indicative of a response of the load to the time-varying signal, such as at least one of the time-varying current in the first current path and the frequency of the time-varying voltage signal (Block 1308). More specifically, the capacitance module 107 may calculate a reference chuck capacitance, Cref, using the dielectric constant, known dimensions and positioning of the chuck 1204, and the equation: Cref=ε(A/d), as discussed further herein. The capacitance module 107 may compare the sensed capacitance, Csense, to the calculated refence chuck capacitance, Cref, such as to compensate for changes in capacitance due to environmental factors (e.g., temperature) and identify changes in capacitance due to changes in wafer position.

Figure 14:
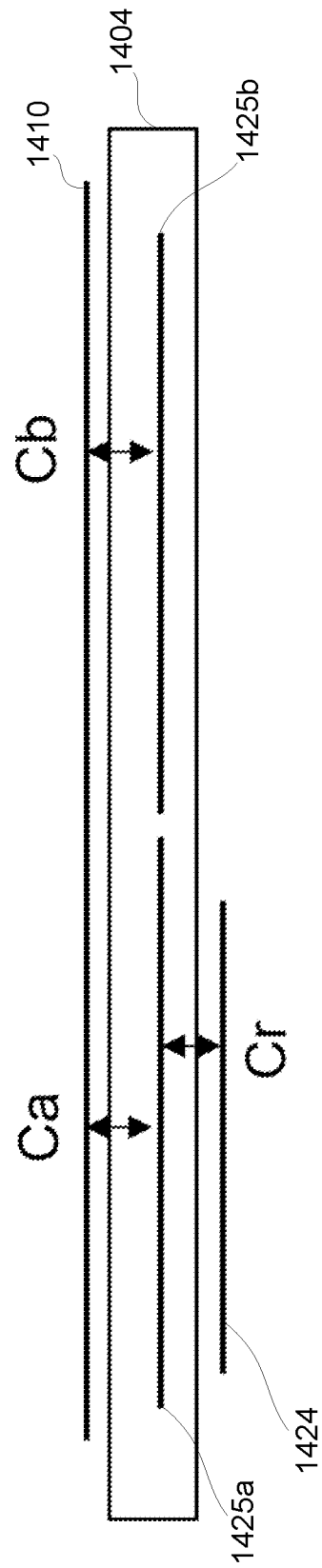
FIG. 14 illustrates a section view of an exemplary wafer, electrostatic chuck, and reference electrode, in accordance with one or more embodiments.

Referring to FIG. 14, shown is a section view of an exemplary wafer 1410, electrostatic chuck 1404, and reference electrode 1424 that may be used in the system 1200 depicted in FIG. 12. As shown, in this implementation, the electrostatic chuck 1404 comprises two clamping electrodes 1425a and 1425b positioned within the electrostatic chuck 1404, and the wafer 1410 is positioned in parallel with a surface of the electrostatic chuck 1404. Also shown is a reference electrode 1424 that is positioned in close proximity to the electrostatic chuck 1404 so that the reference electrode 1424 experiences substantially the same thermal environment as the electrostatic chuck 1404.

Also depicted in FIG. 14 are capacitances Ca, Cb, and Cr where Ca is a capacitance between a portion of the wafer 1410 and the clamping electrode 1425a, Cb is a capacitance between another portion of the wafer 1410 and the clamping electrode 1425b, and Cr is a capacitance between the clamping electrode 1425a and the reference electrode 1424.

The capacitance of Ca, Cb, and Cr may be calculated as Cx=εA/d where A=area, d=distance and c=relative permittivity, also known as dielectric constant, which is varying and unknown.

A capacitance module, such as the capacitance module 107 of FIG. 12, may calculate a combined capacitance of the chuck 1404 and the wafer 1410 as Cref=Ca in series with Cb=ε(Aa/da)*(Ab/db)/(Aa/da+Ab/db). But as discussed above, c varies with temperature, so a temperature compensation module, such as the temperature compensation module 1222 of FIG. 12, is configured to calculate ε based upon the capacitance of the reference electrode 1424 as c=(Cr)(dr)/Ar because dr and Ar are fixed and not affected by the wafer 1410. As discussed above, the capacitance of the reference electrode 1424 may be determined by I=Cr*(dv/dt). So, in operation the temperature compensation module 1222 of FIG. 12 receives a measure of time-varying current in the second current path from the second current monitor 103*b*, and calculates Cr. Then, ε=(Cr)(dr)/Ar is calculated by the temperature compensation module 1222. Thus, Cref may be determined over a wide variety of temperatures and frequencies.

It should be recognized that the electrostatic power supplies and electrostatic chuck systems described herein (which sense capacitance) are not isolated designs. More specifically, aspects of some designs may be combined with aspects of other designs; thus, the present disclosure contemplates many permutations that are not shown in the drawings. In other words, there are many synergies between the aspects of the various implementations.

For example, the techniques for injecting a time-varying signal described with reference to FIGS. 1 and 2, may be utilized in connection with the autoranging aspects described with reference to FIGS. 3-5 and the ratiometric aspects described with reference to FIGS. 9 and 10.

As another example, the autoranging aspects described with reference to FIGS. 3-5 may be used in connection with the capacitance compensation approaches described with reference to FIGS. 11-14.

Moreover, the aspects described with reference to FIGS. 3-5 enable measurement of wide ranges of capacitance using variable frequency, which may be utilized in connection with the implementations described with reference to FIGS. 1 and 2. And some aspects described with reference to FIGS. 3-5 may be considered functional subcomponents of the resonance-related topologies and methodologies described with reference to FIGS. 7 and 8. More specifically, the resonance-related topologies and methodologies described with reference to FIGS. 7 and 8 may be characterized as another way of using a frequency to measure capacitance. In these frequency-related implementations, capacitance is sensed by a change in phase of the time-varying current (e.g., AC current) in contrast to a change in amplitude of the time-varying current.

As another example of the interrelated synergies disclosed herein, the ratiometric techniques described with reference to FIGS. 9 and 10 improve accuracy of capacitance measurements by providing a more stable reference. These techniques may be used in connection with the time-varying injection aspects of FIGS. 1 and 2; the variable frequency and autoranging aspects of FIGS. 3-5; and the capacitance compensation aspects described with reference to FIGS. 11-14.

Figure 15:
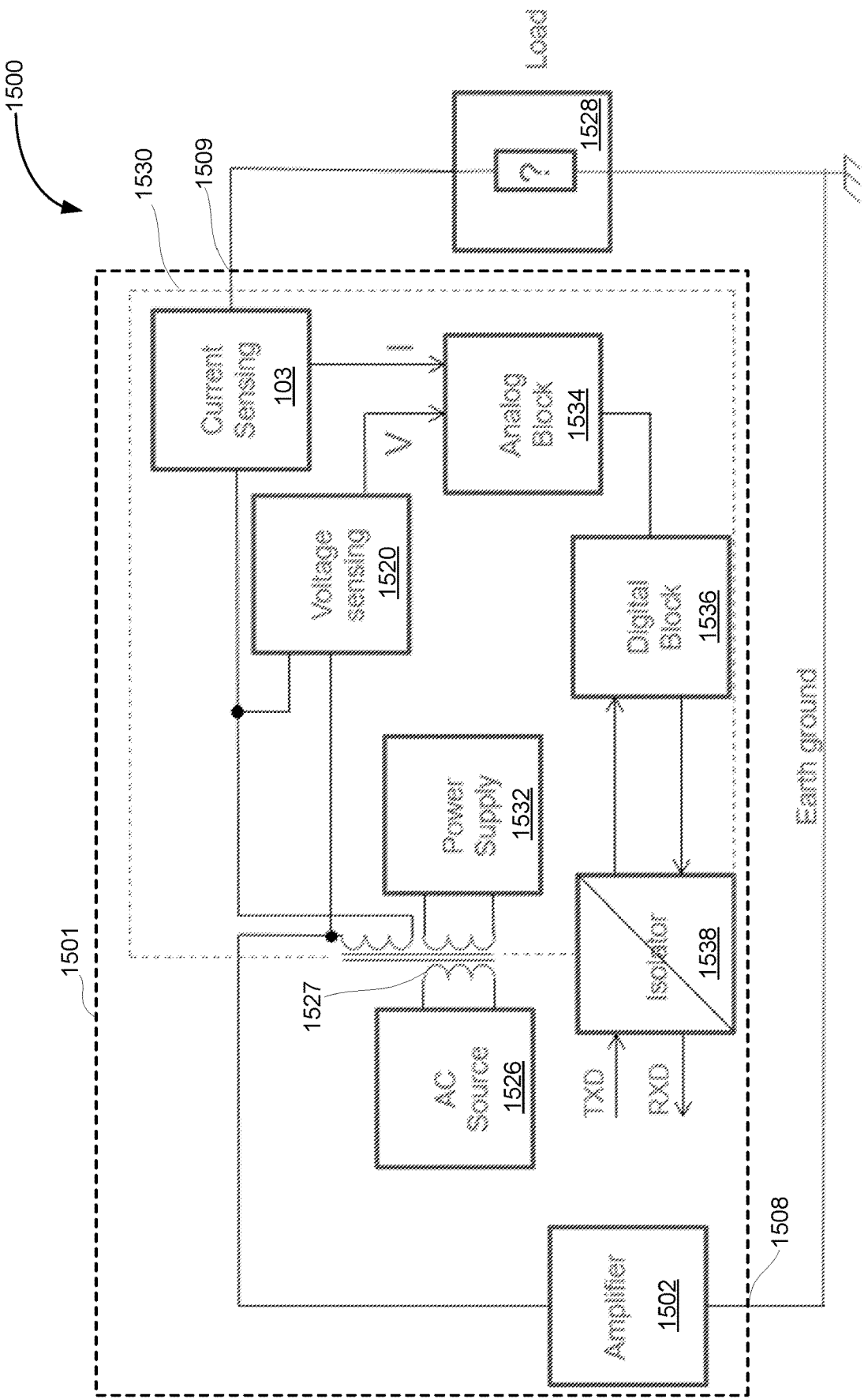
FIG. 15 illustrates an exemplary electrostatic power supply with an AC source configured to provide an injected time-varying signal and power a measurement apparatus, in accordance with one or more embodiments.

Referring now to FIG. 15, shown is a block diagram of a system 1500 depicting another exemplary electrostatic power supply 1501 coupled to a load 1528. As shown, the electrostatic power supply 1501 comprises an AC source 1526 configured to inject a time-varying signal (e.g., AC signal) onto a conduction path connecting the electrostatic power supply 1501 to the load 1528 and to provide power to a measurement apparatus 1530 of the electrostatic power supply 1501. More specifically, the AC source 1526 may inject the time-varying signal onto the conduction path via a first secondary a transformer 1527 and provide power to the measurement apparatus 1530 via a second secondary of the transformer 1527. The electrostatic power supply 1501 further comprises a ground connector 1508 configured to couple to ground, an output connector 1509 configured to couple to the load 1528, and an amplifier 1502 configured to couple to the connection path and to apply a DC offset to the injected time-varying signal on the conduction path between the ground connector 1508 and the output connector 1509. The amplifier 1502 may be realized, for example, by a fixed voltage power supply or a fixed voltage power supply in a bridge to permit polarity reversal.

As shown in FIG. 15, the measurement apparatus 1530 comprises a power supply 1532 configured to receive power from the AC source 1526 via the second secondary the transformer 1527 and distribute power to the measurement apparatus 1530 components. The measurement apparatus 1530 further comprises a current monitor 103 positioned and configured to measure current (e.g., time-varying current) in the conduction path, and a voltage monitor 1520 is coupled across the first secondary of the transformer 1527 to measure the voltage across the first secondary (e.g., a time-varying voltage of the time-varying signal injected by the AC source 1526). It is contemplated that, in other embodiments, the electrostatic power supply 1501 may operate without the voltage monitor 1520 and voltage measuring aspects, instead determining capacitance based soley on the measured current.

The measurement apparatus 1530 further comprises an analog signal processing module 1534, a digital signal processing module 1536, and an isolation module 1538, which may all be components used to realize a capacitance module, such as the capacitance module 107 of FIG. 9 for example. The analog signal processing module 1534 is coupled to the current monitor 103 and the voltage monitor 1520 and is configured to receive an analog current signal representing measured current from the current monitor 103 and to receive an analog voltage signal representing measured voltage from the voltage monitor 1520. The analog signal processing module 1534 may comprise an analog-to-digital converter configured to convert the analog current signal and analog voltage signal into a digital current signal and a digital voltage signal, respectively. It is contemplated that, in some embodiments, the analog processing module 1534 may process the analog current signal and analog voltage signal, such as through filtering, prior to analog-to-digital signal conversion.

The digital signal processing module 1536 is coupled to the analog signal processing module 1534 and configured to receive the digital current signal and digital voltage signal from the analog signal processing module 1534. The digital signal processing module 1536 may process both the digital current signal and digital voltage signal, such as through filtering, asynchronous detection, or other digital signal processing techniques known in the art, to determine a capacitance of the load (e.g., via frequency and phase data extracted from the digital current signal and digital voltage signal). More specifically, the digital signal processing module 1536 may ratiometrically determine the capacitance, in a manner similar to the method depicted in FIG. 10, using a ratio of a time-varying component the digital current signal to a time-varying component of the digital voltage signal; however, it is contemplated that other methods of determining capacitance, such as those disclosed herein, may be implemented by the digital processing module 1536.

The isolation module 1538 is coupled to the digital signal processing module 1536 and configured to communicate with the digital signal processing module 1536, such as to send digital processing configuration data or to receive information from the digital signal processing module 1536 relating to at least one of the capacitance, characteristics of the current and voltage within the conduction path (e.g., frequency, amplitude, phase, etc.), and dielectric constant of a reference electrode. The isolation module 1538 is further configured to send and receive signals outside of the measurement apparatus 1530 enabling external control of the digital signal processing aspects of the measurement apparatus 1530 as well as receipt of information determined by the measurement apparatus 1530, such as the capacitance.

Figure 16:
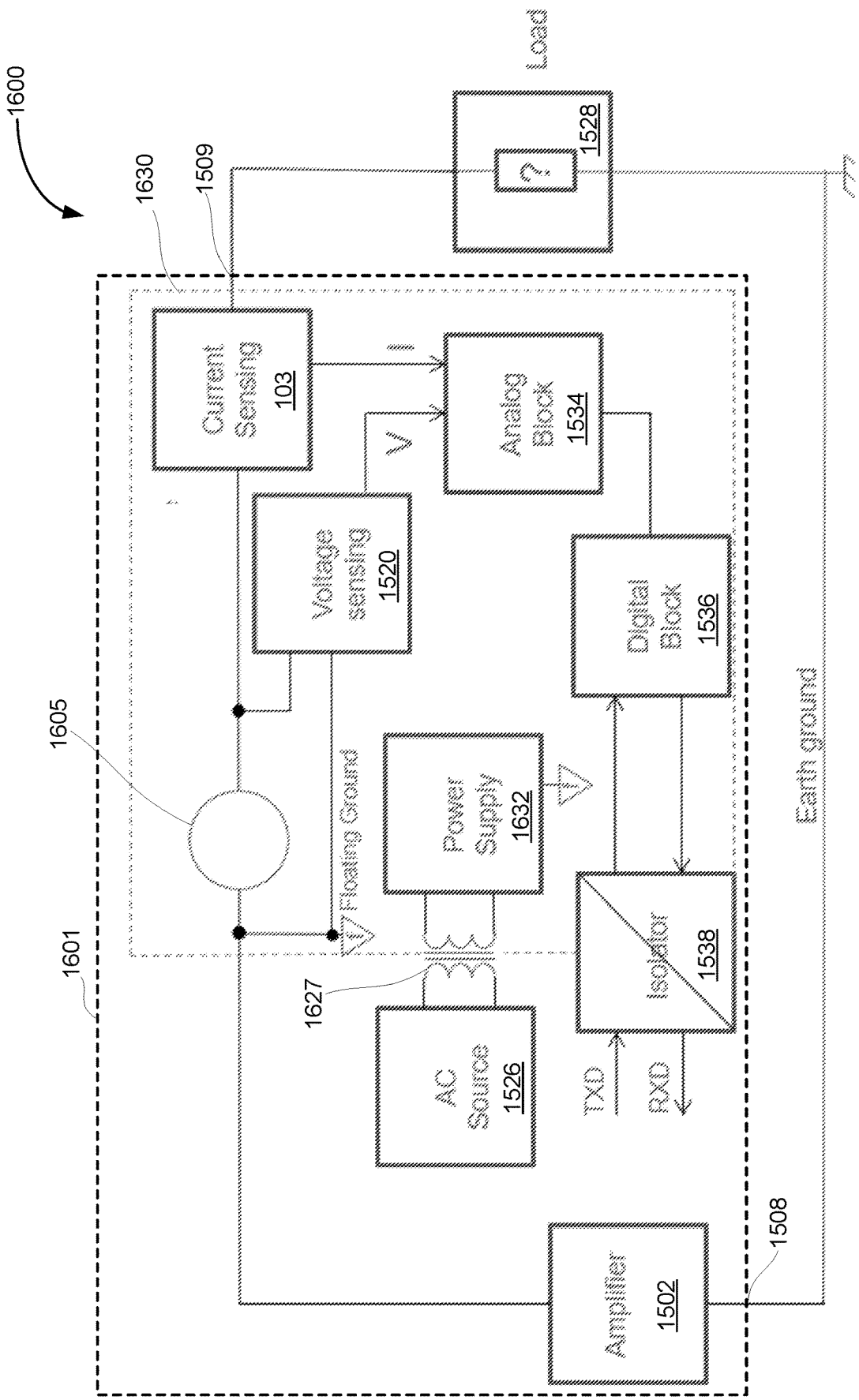
FIG. 16 illustrates an exemplary electrostatic power supply with an AC source configured to power a measurement apparatus comprising a time-varying signal source, in accordance with one or more embodiments.

Referring now to FIG. 16, shown is a block diagram of a system 1600 depicting another exemplary electrostatic power supply 1601 coupled to a load 1528. The electrostatic power supply 1601 is substantively the same as the electrostatic power supply 1501 of FIG. 15, except the AC source 1526 is configured to provide power to the measurement apparatus 1630 of the electrostatic power supply 1601 via a transformer 1627 without injecting a time-varying signal onto the conduction path, and the measurement apparatus 1630 comprises a time-varying signal source 1605 coupled to the conduction path and configured to inject a time-varying signal onto the conduction path. More specifically, the transformer 1627 comprises a single secondary coupled to a power supply 1632 (e.g., a floating power supply) of the measurement apparatus 1630, and the power supply 1632 is configured to receive power from the AC source 1526 via the single secondary and distribute power to the measurement apparatus 1630 components. As a consequence, the transformer 1627 does not directly couple to the conduction path between the between the ground connector 1508 and the output connector 1509. Additionally, the voltage monitor 1520 is coupled across the time-varying signal source 1605, as opposed to being coupled across a transformer secondary as in the FIG. 15, and is configured to measure the voltage across the time-varying signal source 1605 (e.g., a time-varying voltage of the time-varying signal injected by the time-varying signal source 1605).

Figure 17:
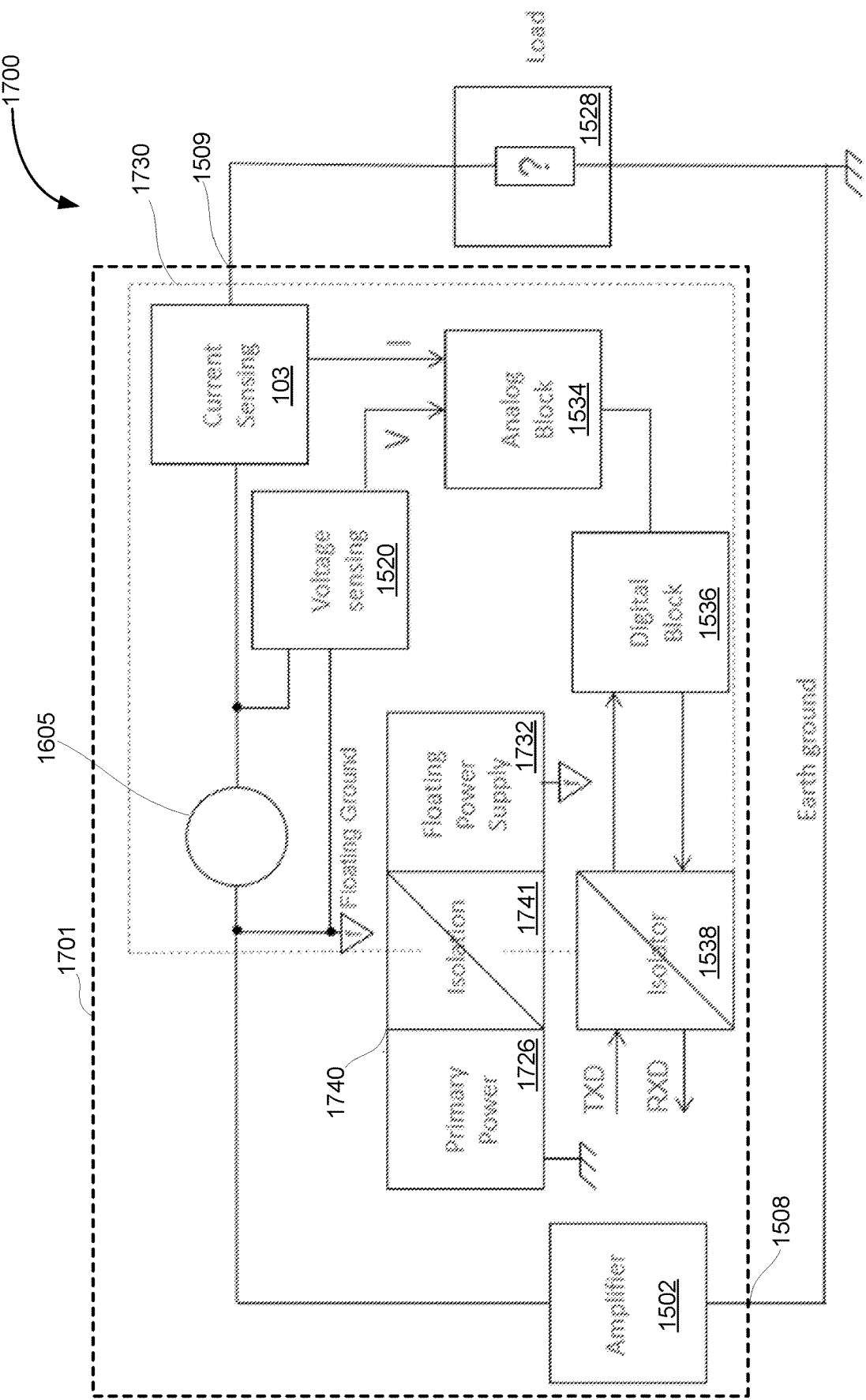
FIG. 17 illustrates an exemplary electrostatic power supply with a DC-to-DC converter configured to power a measurement apparatus comprising a time-varying signal source, in accordance with one or more embodiments.

Referring now to FIG. 17, shown is a block diagram of a system 1700 depicting another exemplary electrostatic power supply 1701 coupled to a load 1528. The electrostatic power supply 1701 is substantively the same as the electrostatic power supply 1601 of FIG. 16, except the AC source 1526, the transformer 1627, and the power supply 1632 are replaced with a DC-to-DC converter 1740 configured to provide power to the measurement apparatus 1730. The DC-to-DC converter 1740 comprises a primary power component 1726 configured to couple to ground, an isolation component 1741, and a floating power supply 1732 of the measurement apparatus 1730. The primary power component 1726 is configured to deliver power to the floating power supply 1732, and the isolation component 1741 is configured to galvanically isolate the primary power component 1726 from the floating power supply 1732. The floating power supply 1732 is configured to receive power from the primary power component 1725 via the galvanic isolation provided by the isolation component 1741 and to distribute power to the measurement apparatus 1730 components.

FIGS. 15-17 demonstrate exemplary topologies which may be used to realize various aspects of the present disclosure (e.g., time-varying signal injection aspects, capacitance module aspects, and signal processing aspects). Furthermore, FIGS. 15-17 exemplify the interrelated synergies disclosed herein, such as through the integration of the disclosed ratiometric aspects of FIGS. 9 and 10 with the time-varying injection aspects (e.g., floating time-varying source aspects) of FIGS. 1 and 3.

Figure 18:
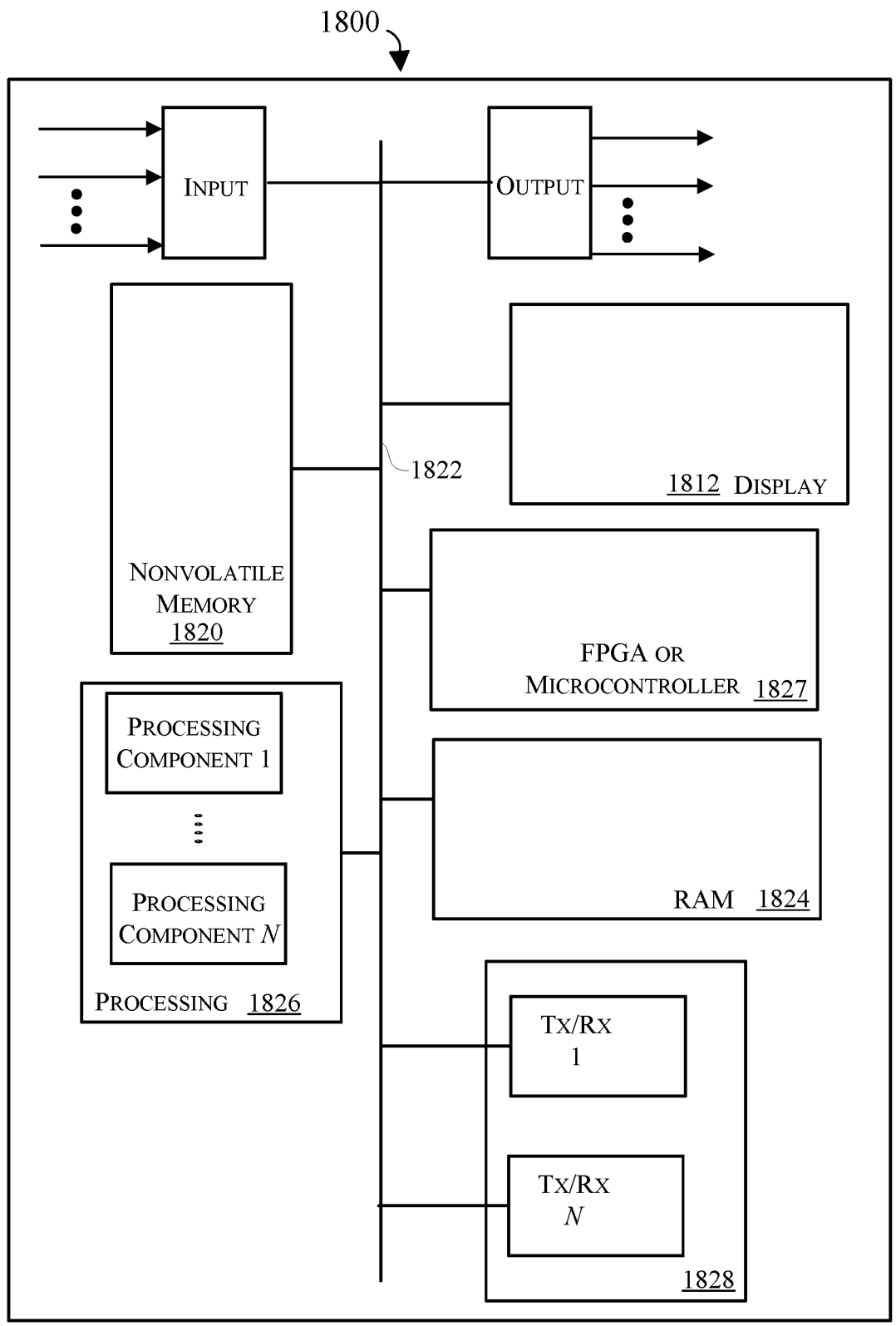
FIG. 18 is an exemplary block diagram depicting physical processing related components that may be used to realize aspects described herein.

As described above, the functions and methods described in connection with the embodiments disclosed herein may be effectuated utilizing hardware, in processor executable instructions encoded in non-transitory machine readable medium, or as a combination of the two. Referring to FIG. 18 for example, shown is a block diagram depicting physical components that may be utilized to realize one or more aspects of the capacitance sensing technologies disclosed herein. Moreover, multiple instances of the computing device depicted in FIG. 18 may be implemented in the systems described herein. As shown, in this embodiment a display 1812 and nonvolatile memory 1820 are coupled to a bus 1822 that is also coupled to random access memory ("RAM") 1824, a processing portion (which includes N processing components) 1826, a field programmable gate array (FPGA) 1827, and a transceiver component 1828 that includes N transceivers. Although the components depicted in FIG. 18 represent physical components, FIG. 18 is not intended to be a detailed hardware diagram; thus, many of the components depicted in FIG. 18 may be realized by common constructs or distributed among additional physical components. Moreover, it is contemplated that other existing and yet-to-be developed physical components and architectures may be utilized to implement the functional components described with reference to FIG. 18.

The display 1812 generally operates to provide a user interface for a user, and in several implementations, the display 1812 is realized by a touchscreen display. For example, display 1812 can be implemented as a part of the current monitors and capacitance modules to enable a user to change settings of the systems disclosed herein and/or receive operational feedback about the systems comprising workpiece (e.g., wafer) position information and capacitance information.

In general, the nonvolatile memory 1820 is non-transitory memory that functions to store (e.g., persistently store) data and machine readable (e.g., processor executable) code (comprising executable code that is associated with effectuating the methods described herein). In some embodiments, for example, the nonvolatile memory 1820 includes bootloader code, operating system code, file system code, and non-transitory processor-executable code to facilitate the execution of the methods described herein. The nonvolatile memory 1820 may also be used to store empirically obtained data that relates workpiece position to capacitance data.

In many implementations, the nonvolatile memory 1820 is realized by flash memory (e.g., NAND or ONENAND memory), but it is contemplated that other memory types may also be utilized. Although it may be possible to execute the code from the nonvolatile memory 1820, the executable code in the nonvolatile memory is typically loaded into RAM 1824 and executed by one or more of the N processing components in the processing portion 1826.

In operation, the N processing components in connection with RAM 1824 may generally operate to execute the instructions stored in nonvolatile memory 1820 to realize the functionality of one or more components and modules disclosed herein. As one of ordinary skill in the art will appreciate, the processing portion 1826 may include a video processor, digital signal processor (DSP), graphics processing unit (GPU), and other processing components. In digital implementations, a DSP may be used to effectuate aspects of the time-varying signal injection.

In addition, or in the alternative, the field programmable gate array (FPGA) 1827 may be configured to effectuate one or more aspects of the functions and methodologies described herein. For example, non-transitory FPGA-configuration-instructions may be persistently stored in non-volatile memory 1820 and accessed by the FPGA 1827 (e.g., during boot up) to configure the FPGA 1827 to effectuate the functions described herein.

The input component may operate to receive signals (e.g., from current sensors) that are indicative of the monitored time-varying current. And the output component generally operates to provide one or more analog or digital signals to effectuate an operational aspect of components described herein. For example, the output portion may transmit output signal(s) indicative of current levels to workpiece position modules.

The depicted transceiver component 1828 includes N transceiver chains, which may be used for communicating with external devices via wireless or wireline networks. Each of the N transceiver chains may represent a transceiver associated with a particular communication scheme (e.g., WiFi, Ethernet, Profibus, etc.).

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An apparatus for measuring capacitance of a load, the apparatus comprising:
   a ground connector configured to couple to ground;
   an output connector configured to couple to the load;
   a floating time-varying signal source;
   a DC power source, wherein:
      the DC power source and the floating time-varying signal source are arranged in a series conduction path between the ground connector and the output connector;
      the DC power source is configured to apply a DC voltage onto the conduction path; and
      the floating time-varying signal source is coupled between the DC power source and the output connector, and configured to inject a time-varying signal onto the conduction path;
   a current monitor configured to measure current in the conduction path; and
   a capacitance module coupled to the current monitor, the capacitance module configured to determine the capacitance based upon the measured current.

2. The apparatus of claim 1, wherein the capacitance module is configured to determine the capacitance by processing a digital signal representation of the measured current.

3. The apparatus of claim 1, wherein the floating time-varying signal source couples the time-varying signal to the conduction path via a transformer.

4. The apparatus of claim 1, wherein:
   the floating time-varying signal source is a floating AC signal source configured to inject an AC signal onto the conduction path; and
   the floating AC signal source includes a direct digital synthesizer to produce a DC representation of the AC signal and a digital-to-analog converter to convert the DC representation to the AC signal, wherein the direct digital synthesizer and the digital-to-analog converter receive power and control signals via galvanically-isolating coupling.

5. The apparatus of claim 1, wherein the floating time-varying signal source includes an oscillator to produce the time-varying signal, wherein the oscillator receives power and control signals via galvanically-isolating coupling.

6. The apparatus of claim 1, wherein the DC power source is coupled between the floating time-varying signal source and the output connector.

7. The apparatus of claim 1, wherein the DC power source is a switch mode power supply.

8. The apparatus of claim 1, wherein the time-varying signal source includes a linear amplifier.

9. The apparatus of claim 1, wherein the current monitor includes one or more of a flux gate sensor, a resistive shunt sensor, a hall effect sensor, or a current mirror circuit.

10. The apparatus of claim 1, wherein the current monitor includes one or more of a peak to peak detector, root-mean-square detector, or a synchronous detector to measure AC current in the conduction path.

11. An apparatus for measuring capacitance of a load, the apparatus comprising:
    a ground connector configured to couple to ground;
    an output connector configured to couple to the load;
    a time-varying signal source configured to inject a time-varying voltage signal onto a conduction path between the ground connector and the output connector;
    a DC power source configured to apply a DC offset to the time-varying voltage signal; wherein the DC power source and the time-varying signal source are arranged in series on the conduction path between the ground connector and the output connector, and the time-varying signal source is a floating time-varying signal source coupled between the DC power source and the output connector that couples the time-varying voltage signal to the conduction path via a transformer;
    a current monitor configured to measure time-varying current in the conduction path; and
    a capacitance module configured to determine the capacitance based upon at least one of the time-varying current and a frequency of the time-varying voltage signal.

12. The apparatus of claim 11, wherein the time-varying signal source is coupled between the ground connector and the DC power source.

13. The apparatus of claim 11, further comprising:
    a resonant sensing module configured to vary the frequency of the time-varying voltage signal to achieve resonance;
    wherein the capacitance module is configured to determine the capacitance based upon the frequency of the time-varying voltage signal when resonance is achieved.

14. The apparatus of claim 11, further comprising:
    a voltage monitor configured to measure a voltage applied by the time-varying signal source;
    wherein the capacitance module is configured to determine the capacitance based upon a ratio of the time-varying current to the voltage applied by the time-varying signal source.

15. The apparatus of claim 11, further comprising:
    a second time-varying signal source configured to apply a second time-varying voltage signal to a reference load to monitor variations in a dielectric constant of a dielectric of the load due to temperature;

wherein the capacitance module is configured to determine the capacitance of the load based upon the dielectric constant and at least one of the time-varying current and the frequency of the time-varying voltage signal.

16. The apparatus of claim 11, further comprising:

an autoranging module configured to:

control the time-varying signal source to maintain a substantially constant amplitude of the time-varying voltage signal; and control the time-varying signal source to vary the frequency of the time-varying voltage signal to maintain a substantially constant amplitude of the time-varying current in the conduction path;

wherein the capacitance module is configured to determine the capacitance based upon the frequency of the time-varying voltage signal.

17. The apparatus of claim 11, further comprising:

an autoranging module configured to:

control the time-varying signal source to maintain a substantially constant amplitude of the time-varying voltage signal; and control the time-varying signal source to vary the time-varying current to maintain a substantially constant frequency of the time-varying voltage signal in the conduction path;

wherein the capacitance module is configured to determine the capacitance based upon the time-varying current.

18. A method for determining capacitance of a load, the method comprising:

applying a time-varying voltage signal with a time-varying signal source to the load;

galvanically isolating the time-varying signal source from ground;

applying a DC offset to the load with a DC power source;

fixing an amplitude of the time-varying voltage signal;

measuring a time-varying current that is provided to the load;

controlling the time-varying signal source to vary a frequency of the time-varying voltage signal to maintain a substantially constant amplitude of the time-varying current provided to the load; and determining the capacitance based upon the frequency of the time-varying voltage signal.

* * * * *